United States Patent
Kasai et al.

[11] Patent Number: 5,856,938
[45] Date of Patent: Jan. 5, 1999

[54] SMALL-SIZED MULTI-VALUED SEMICONDUCTOR MEMORY DEVICE WITH COUPLED CAPACITORS BETWEEN DIVIDED BIT LINES

[75] Inventors: Naoki Kasai; Hiroshi Watanabe; Hiroki Koga, all of Tokyo, Japan

[73] Assignee: NEC Corporation, Tokyo, Japan

[21] Appl. No.: 806,512

[22] Filed: Feb. 24, 1997

[30] Foreign Application Priority Data

Feb. 26, 1996 [JP] Japan .................................. 8-034678
Apr. 5, 1996 [JP] Japan .................................. 8-083424
Sep. 13, 1996 [JP] Japan .................................. 8-243566

[51] Int. Cl.$^6$ .................................................. G11C 11/24
[52] U.S. Cl. ............................... 365/149; 365/51; 365/63
[58] Field of Search ................................. 365/149, 145, 365/205, 51, 63

[56] References Cited

U.S. PATENT DOCUMENTS

| | | | |
|---|---|---|---|
| 4,980,860 | 12/1990 | Houston et al. | 365/189.11 |
| 5,406,512 | 4/1995 | Kagenishi | 365/149 |
| 5,416,734 | 5/1995 | Hidaka et al. | 365/63 |
| 5,592,411 | 1/1997 | Tai | 365/145 |
| 5,596,521 | 1/1997 | Tanaka et al. | 365/49 |

*Primary Examiner*—Daivd Nelms
*Assistant Examiner*—Hoai V. Ho
*Attorney, Agent, or Firm*—Foley & Lardner

[57] ABSTRACT

In a $2^m$ (m=1, 2, . . . )-valued semiconductor memory device, including a plurality of word lines, a plurality of bit line pairs, and a plurality of memory cells each connected to one of the word lines and one bit line of the bit line pairs, each of the bit line pairs are divided into m divided bit line pairs, and a ratio of capacitances of the m divided bit line pairs is $1:2: \ldots :2^{m-1}$. Also, each sense amplifier is connected to one of the bit line pairs. Further, each of coupled capacitor pairs is cross-coupled between two adjacent divided bit line pairs of the divided bit line pairs.

36 Claims, 27 Drawing Sheets

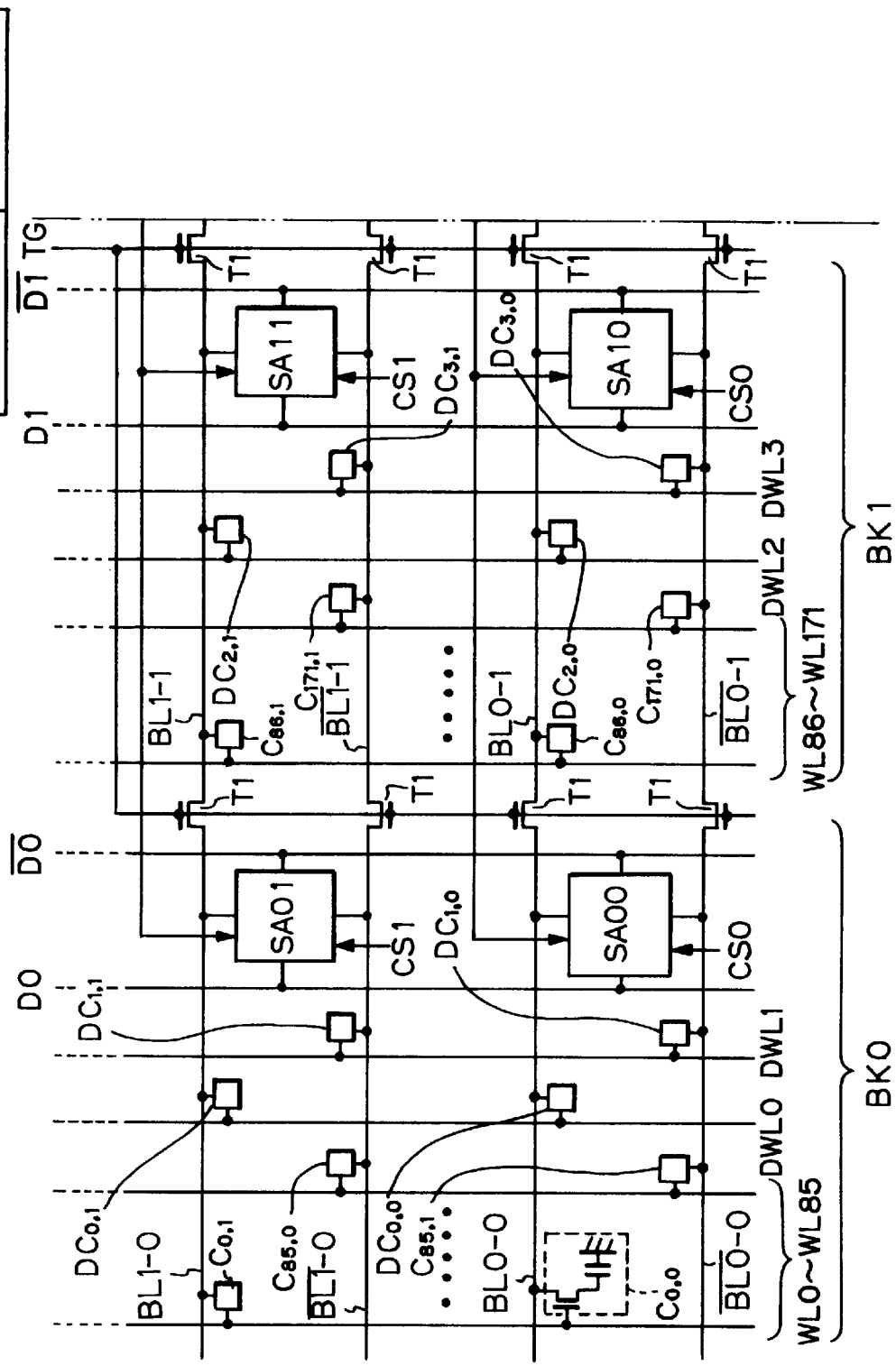

Fig. 2 PRIOR ART

| D2 | D1 | D0 | D1' | D0' |
|---|---|---|---|---|
| L | L | L | L | L |
| L | L | H | L | H |
| L | H | H | H | L |
| H | H | H | H | H |

PRIOR ART

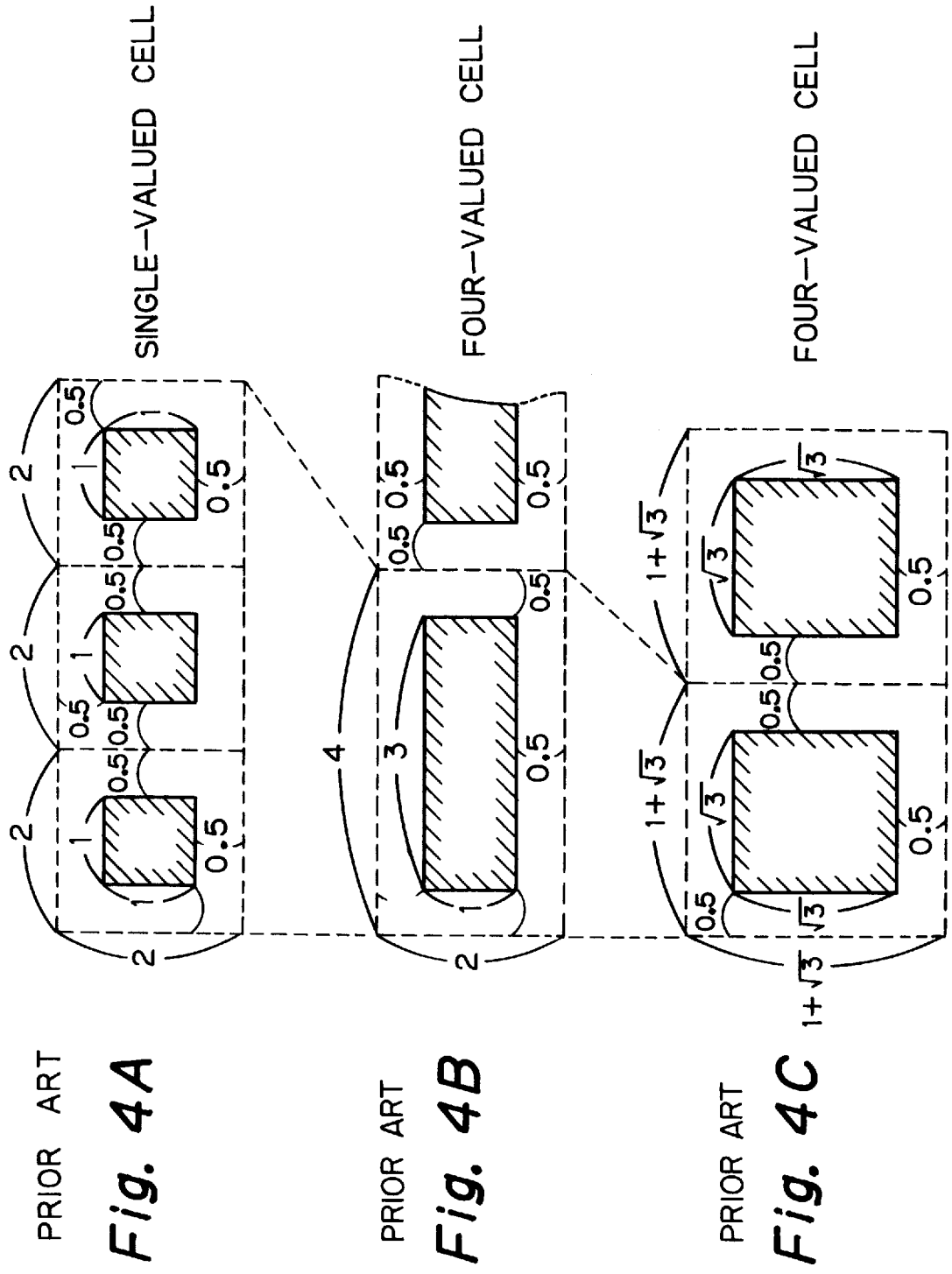

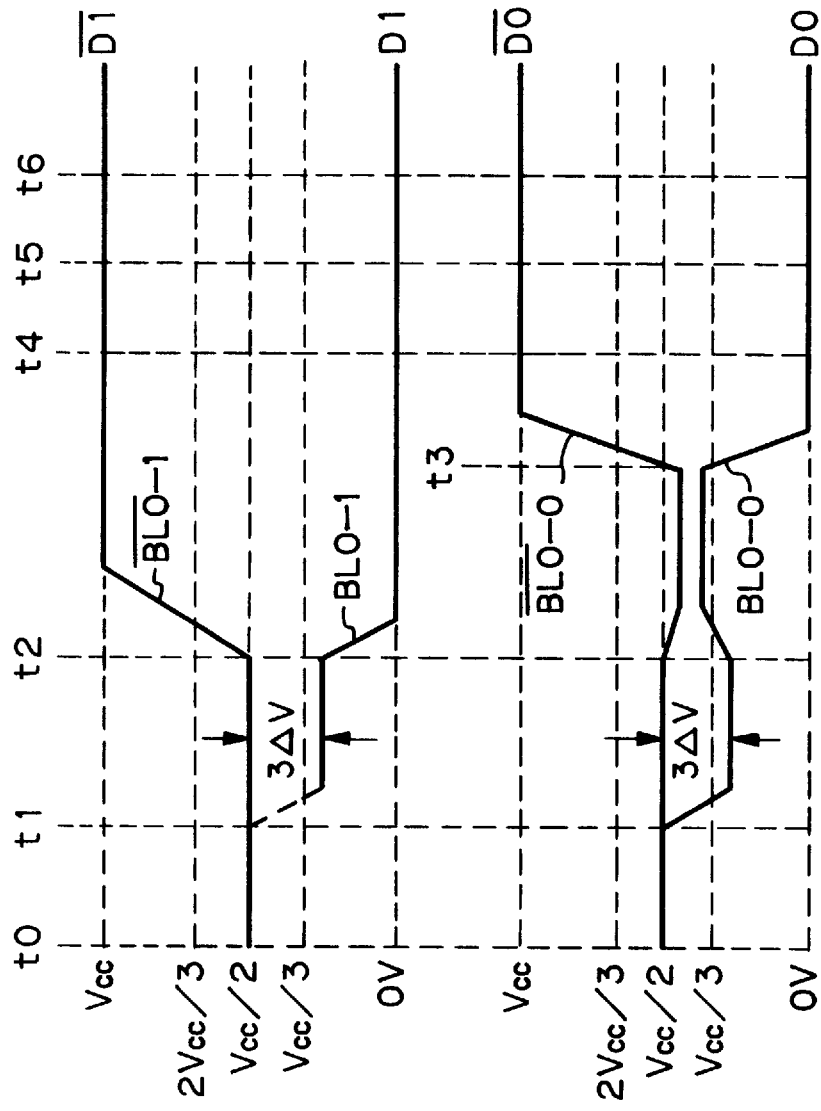

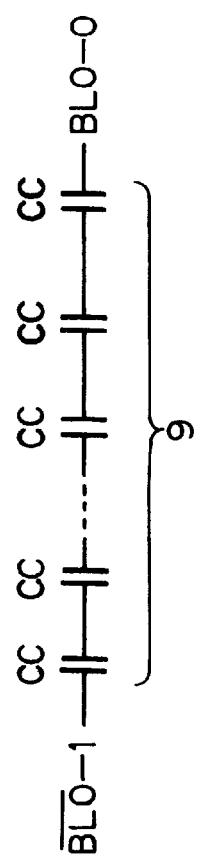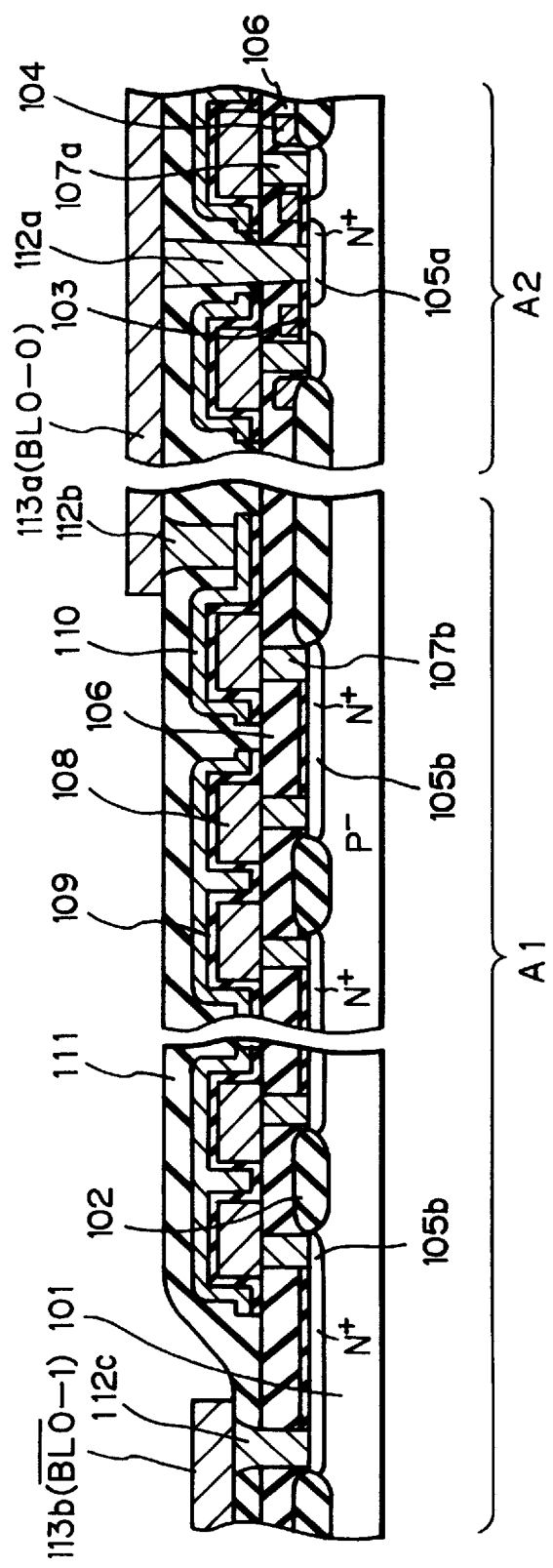
Fig. 19

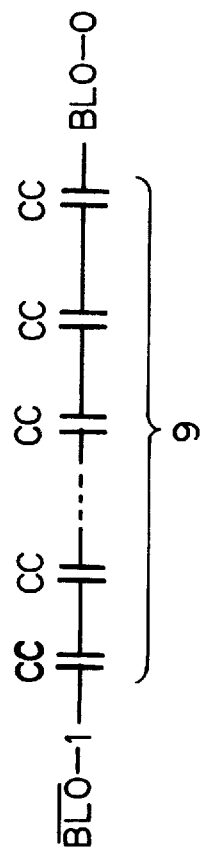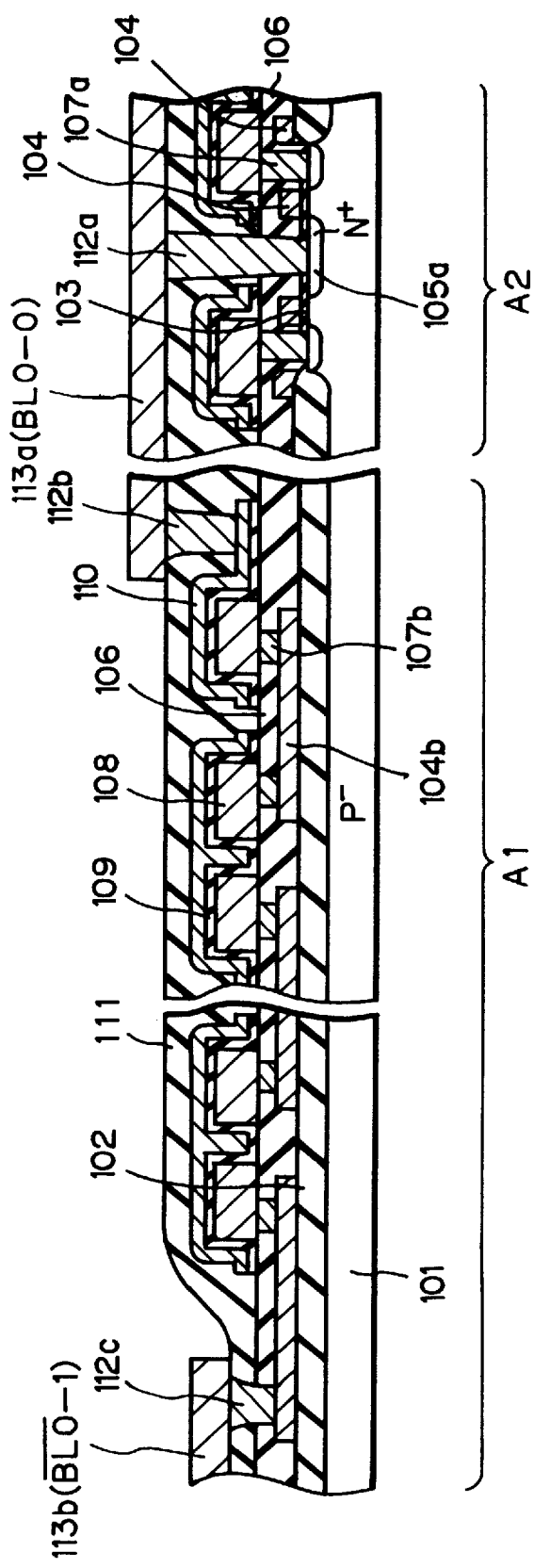
Fig. 20

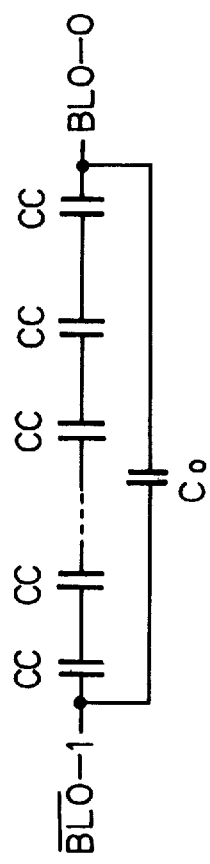
Fig. 21
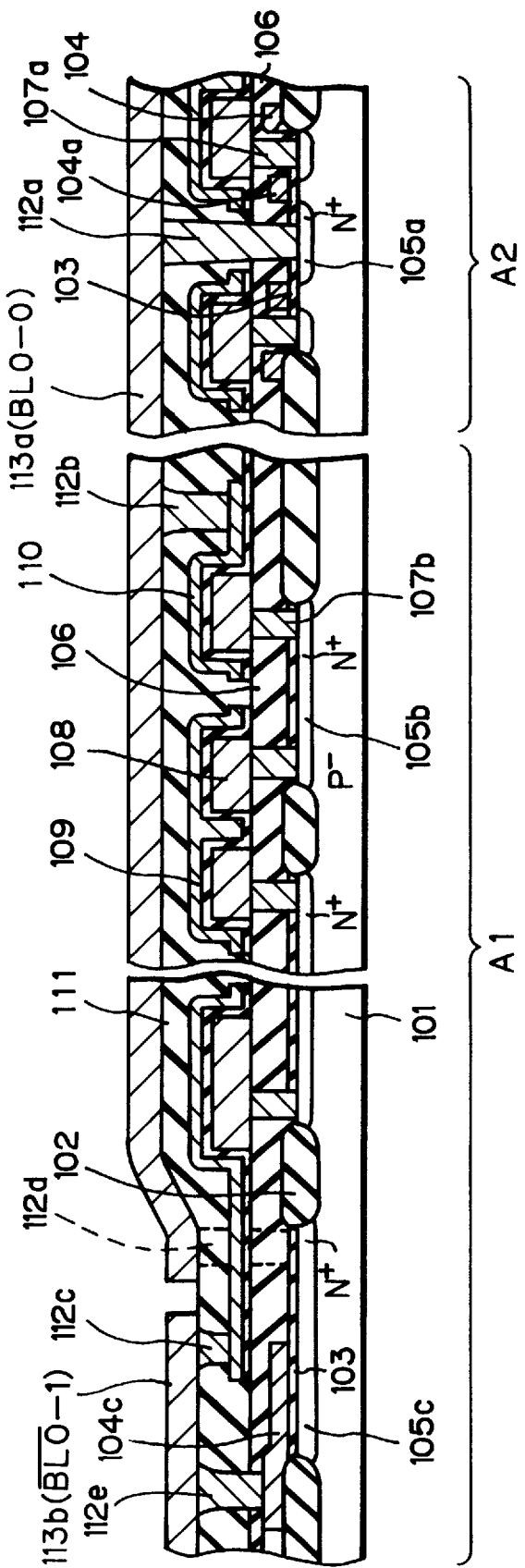

SMALL-SIZED MULTI-VALUED SEMICONDUCTOR MEMORY DEVICE WITH COUPLED CAPACITORS BETWEEN DIVIDED BIT LINES

BACKGROUND OF THE INVENTION

1. Field of the Invention

The present invention relates to a multi-valued semiconductor memory device.

2. Description of the Related Art

In a semiconductor memory device such as a dynamic random access memory (DRAM) device, if m-bit information is stored in each memory cell, the storage capacity becomes m times that of a conventional single-valued memory device.

In a prior art four-valued DRAM device (see: JP-A-63-149900), three sense amplifiers are provided for one bit line pair, and also, dummy memory cells are provided. As a result, the chip area is still larger than the conventional single-valued devices, which reduces the manufacturing yield.

SUMMARY OF THE INVENTION

It is an object of the present invention to enhance the manufacturing yield of a multi-valued semiconductor memory device.

According to the present invention, in a $2^m$ (m=1, 2, ...)-valued semiconductor memory device, including a plurality of word lines, a plurality of bit line pairs, and a plurality of memory cells each connected to one of the word lines and one bit line of the bit line pairs, each of the bit line pairs are divided into m divided bit line pairs, and a ratio of capacitances of the m divided bit line pairs is $1:2:\ldots:2^{m-1}$. Also, each sense amplifier is connected to one of the bit line pairs. Further, each coupled capacitor pair is cross-coupled between two adjacent divided bit line pairs of the divided bit line pairs.

Thus, the number of sense amplifiers is reduced. Also, dummy memory cells are unnecessary.

BRIEF DESCRIPTION OF THE DRAWINGS

The present invention will be more clearly understood from the description as set forth below, as compared with the prior art, with reference to the accompanying drawings, wherein:

FIGS. 1A and 1B are a circuit diagram illustrating a prior art four-valued DRAM device;

FIG. 2 is a table showing the operation of the output circuit of FIG. 1;

FIGS. 4A, 4B and 4C are plan views for explaining the memory cells of FIG. 1;

FIGS. 19 through 26 are cross-sectional views for explaining the manufacture of the coupled capacitor in the circuits of FIGS. 6, 16 and 17.

DESCRIPTION OF THE PREFERRED EMBODIMENTS

Before the description of the preferred embodiments, a prior art four-valued DRAM device will be explained with reference to FIGS. 1A and 1B (see: JP-63-149900).

Figure 1B:
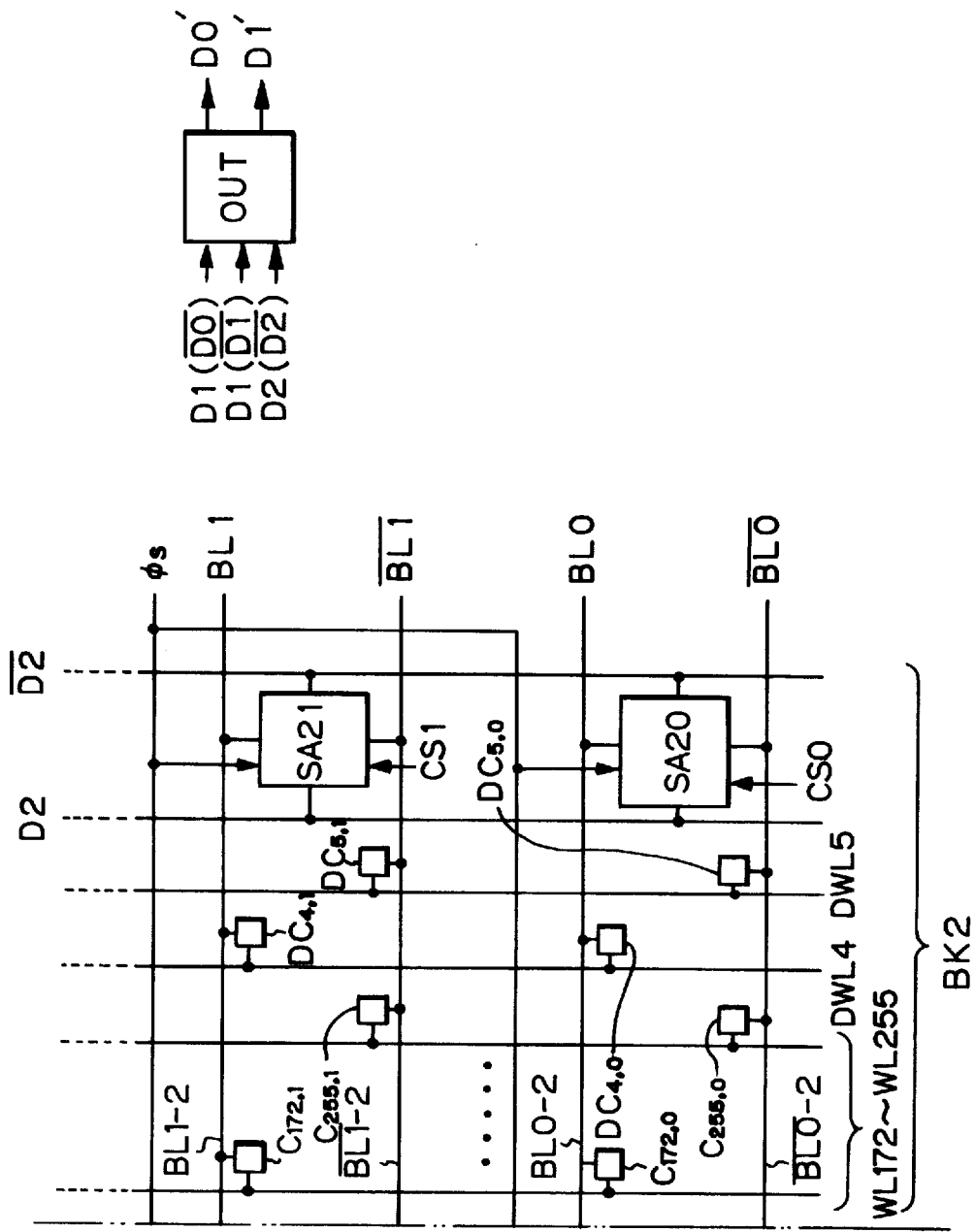

In FIGS. 1A and 1B, bit lines BL0, $\overline{BL0}$, BL1, $\overline{BL1}$ are divided into three blocks BK0, BK1 and BK2 which are electrically separated by transfer gates T1 controlled by a gate selection signal TG. For example, the bit line BL0 is divided into divided bit lines BL0-0, BL0-1 and BL0-2 for the blocks BK0, BK1 and BK2, respectively.

In the block BK0, word lines WL0 to WL85 and dummy word lines DWL0 and DWL1 are provided. Also, memory cells $C_{0,\,0}, \ldots, C_{85,\,0}$ and $C_{0,\,1}, \ldots, C_{85,\,1}$ are provided at intersections between the word lines WL0 to WL85 and the divided bit lines BL0-0, $\overline{BL0}$-0, BL1-0 and $\overline{BL1}$-0, and dummy memory cells $DC_{0,\,0}$, $DC_{0,\,1}$, $DC_{1,\,0}$, $DC_{1,\,1}$ are provided at intersections between the dummy word lines DWL0 and DWL1 and the divided bit lines BL0-0, $\overline{BL0}$-0, BL1-0 and $\overline{BL1}$-0. Further, a sense amplifier SA00 is connected to the divided bit lines BL0-0 and $\overline{BL0}$-0, and a sense amplifier SA01 is connected to divided the bit lines BL1 and $\overline{BL1}$-0. The sense amplifiers SA00 and SA01 are connected to data lines D0 and $\overline{D0}$.

In the block BK1, word lines WL86 to WL171 and dummy word lines DWL2 and DWL3 are provided. Also, memory cells $C_{86,\,0}, \ldots, C_{171,\,0}$ and $C_{86,\,1}, \ldots, C_{171,\,1}$ are provided at intersections between the word lines WL86 to WL171 and the divided bit lines BL0-1, $\overline{BL0}$-1, BL1-1 and $\overline{BL1}$-1, and dummy memory cells $DC_{2,\,0}$, $DC_{2,\,1}$, $DC_{3,\,0}$ and $DC_{3,\,1}$ are provided at intersections between the dummy word lines DWL2 and DWL3 and the divided bit lines BL0-1, $\overline{BL0}$-1, BL1-1 and $\overline{BL1}$-1. Further, a sense amplifier SA10 is connected to the divided bit lines BL0-1 and $\overline{BL0}$-1, and a sense amplifier SA11 is connected to the divided bit lines BL1-1 and $\overline{BL1}$-1. The sense amplifiers SA10 and SA11 are connected to data lines D1 and $\overline{D1}$.

In the block BK2, word lines WL172 to WL255 and dummy word lines DWL4 and DWL5 are provided. Also, memory cells $C_{172,\,0}, \ldots, C_{255,\,0}$ and $C_{172,\,1}, \ldots, C_{255,\,1}$ are provided at intersections between the word lines WL172 to WL255 and the divided lines BL0-2, $\overline{BL0}$-2, BL1-2 and $\overline{BL1}$-2, and dummy memory cells $DC_{4,\,0}$, $DC_{4,\,1}$, $DC_{5,\,0}$, $DC_{5,\,1}$ are provided at intersections between the dummy word lines DWL4 and DWL5 and the divided bit lines BL0-2, $\overline{BL0}$-2, BL1-2, $\overline{BL1}$-2. Further, a sense amplifier SA20 is connected to the divided bit lines BL0-2 and $\overline{BL1}$-2, and a sense amplifier SA21 is connected to divided the bit lines BL1-2 and $\overline{BL1}$-2. The sense amplifiers SA20 and SA21 are connected to data lines D2 and $\overline{D2}$.

The sense amplifier SA00, SA0, SA10, SA11, SA20 and SA21 are enabled by a sense activation signal $\phi_S$.

In FIG. 1, note that reference OUT designates an output circuit for converting three-bit data at the data lines D0, $\overline{D0}$, D1, $\overline{D1}$, D2 and $\overline{D2}$ into two-bit data D0' D1'.

Each of the memory cells $C_{0,0}$, $C_{0,1}$, ..., $C_{255,1}$ is of a one-transistor, one-capacitor type which is formed by an N-channel MOS transistor and a capacitor. This capacitor can store information corresponding to one of the following voltages:

| | |
|---|---|
| 0 V | (0, 0) |
| $V_{cc}/3$ | (0, 1) |
| $2V_{cc}/3$ | (1, 0) |
| $V_{cc}$ | (1, 1) | where $V_{CC}$ is a power supply voltage.

Also, each of the dummy memory cells $DC_{0,0}$, $DC_{0,1}$, ..., $DC_{5,1}$ is of a one-transistor, one-capacitor type which is formed by an N-channel MOS transistor and a capacitor. In this case, the capacitor of each of the dummy memory cells $DC_{0,0}$, $DC_{0,1}$, $DC_{1,0}$, $DC_{1,1}$ stores information corresponding to $V_{CC}/6$, the capacitor of each of the dummy memory cells $DC_{2,0}$, $DC_{2,1}$, $DC_{3,0}$ and $DC_{3,1}$ stores information corresponding to $V_{CC}/2$, and the capacitor of each of the dummy memory cells $DC_{4,0}$, $DC_{4,1}$, $DC_{5,0}$, $DC_{5,1}$ stores information corresponding to 5 $V_{CC}/6$.

Input data and output data of the output circuit OUT is shown in FIG. 2.

The read operation of the device of FIG. 1 is explained next with reference to FIGS. 3A, 3B and 3C. Here, assume that information corresponding to 2 $V_{CC}/3$ is stored in the memory cell $C_{0,0}$.

First, at time t0, the voltage of the gate selection signal TG is made high, so that the bit lines BL0, $\overline{BL0}$, BL1, and $\overline{BL1}$ are electrically connected over the blocks BK0, BK1 and BK2. Also, the bit lines BL0, $\overline{BL0}$, BL1 and $\overline{BL1}$ are precharged by precharging transistors (riot shown) to $V_{CC}/2$.

Figure 3A:
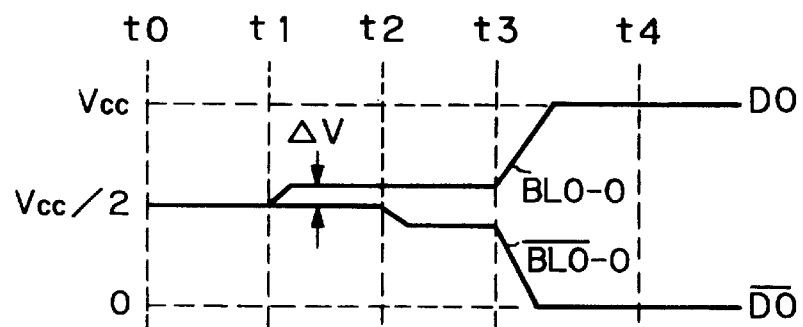
FIGS. 3A, 3B and 3C are timing diagrams showing the operation of the device of FIG. 1.
Figure 3B:
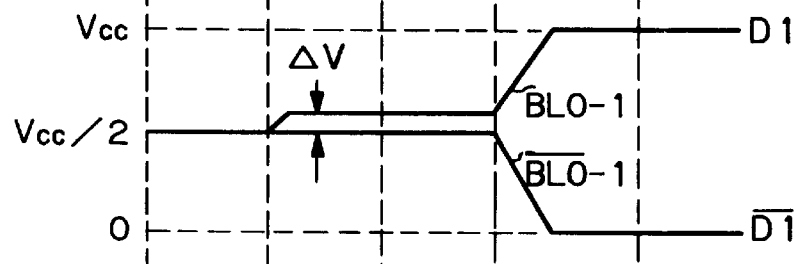
Figure 3C:
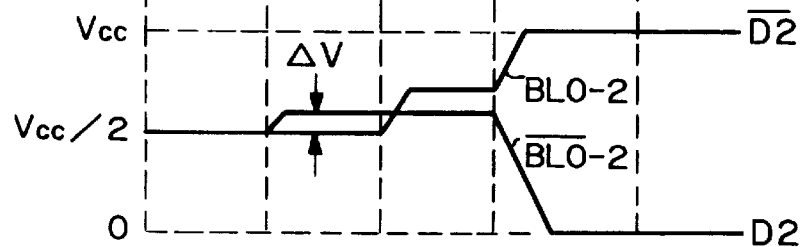

Next, at time t1, the voltage at the word line WL0 is made high, so that the voltage at the bit lines BL0 is increased by $\Delta V$ over the blocks BK0, BK1 and BK2, as shown in FIGS. 3A, 3B and 3C. In this case, note that the voltage at the bit line $\overline{BL0}$ remains at $V_{CC}/2$. Then, the voltage of the gate selection signal TG is made low, so that the bit lines BL0, $\overline{BL0}$; BL1, $\overline{BL1}$ are electrically separated for each of the blocks BK0, BK1 and BK2.

Next, at time t2, the voltages at the dummy word lines DWL1, DWL3 and DWL5 are made high.

Therefore, in the block BK0, since the information of the dummy memory cell $DC_{1,0}$ is $V_{CC}/6$ which is lower than the precharging voltage $V_{CC}/2$, the voltage at the divided bit line $\overline{BL0}$-0 is decreased as shown in FIG. 3A. As a result, the voltage at the divided bit lines BL0-0 is higher than the voltage at the divided bit line $\overline{BL0}$-0.

In the block BK1, since the information of the dummy memory cell $DC_{3,0}$ is $V_{CC}/2$ which is the same as the precharging voltage $V_{CC}/2$, the voltage at the divided bit line $\overline{BL0}$-1 remains at the same level as shown in FIG. 3B. As a result, the voltage at the divided bit lines BL0-1 is still higher than the voltage at the divided bit line $\overline{BL0}$-1.

Further, in the block BK2, since the information of the dummy memory cell $DC_{5,0}$ is 5 $V_{CC}/6$ which is higher than the precharging voltage $V_{CC}/2$, the voltage at the divided bit line $\overline{BL0}$-2 is increased as shown in FIG. 3C. As a result, the voltage at the divided bit lines BL0-2 is lower than the voltage at the divided bit line $\overline{BL0}$-2.

Next, at time L3, the sense activation signal $\phi_S$ is made high to activate the sense amplifiers SA00, SA01, SA10, SA11, SA20, SA21. As a result, the difference in potential between the bit lines BL0 and $\overline{BL0}$ is increased. That is, as shown in FIG. 3A, the voltage at the divided bit line BL0-0 is increased to $V_{CC}$ and the voltage at the divided bit line $\overline{BL0}$-0 is decreased to 0 V. Also, as shown in FIG. 3B, the voltage at the divided bit line BL0-1 is increased to $V_{CC}$ and the voltage at the divided bit line $\overline{BL0}$-1 is decreased to 0 V. Further, as shown in FIG. 3C, the voltage at the divided bit line $\overline{BL0}$-1 is increased to $V_{CC}$ and the voltage at the divided bit line BL0-2 is decreased to 0 V.

Finally, at time t4, a column of the sense amplifiers SA00, SA10 and SA20 is selected by a column selection signal CS0, so that data at the data lines D0, $\overline{D0}$; D1, $\overline{D1}$; and D2, $\overline{D2}$ is determined by the data at the divided bit lines BL0-0, $\overline{BL0}$-0, BL0-1, $\overline{BL0}$-1, BL0-2 and $\overline{BL0}$-2, respectively.

Thus, data at the data lines D0, $\overline{D0}$, D1, $\overline{D1}$, D2 and $\overline{D2}$ is obtained as indicated by (D2, D1, D0)=(L, H, H)

Then, this data is converted by the output circuit OUT into (D1', D0')=(H, L)=(1, 0)

In the device of FIG. 1, if the ability of sense amplifiers SA00, SA01, ..., SA21 is the same as that of conventional sense amplifiers for single-valued DRAM devices, i.e., if the minimum difference in potential between selected bit lines which can be sensed in the device of FIG. 1 is the same as in conventional single-valued DRAM devices, the capacitance of each of the memory cells $C_{0,0}$, $C_{0,1}$, ..., $C_{255,1}$ needs to be three times that of each memory cell of the conventional single-valued DRAM devices. Note that, if the acceptable minimum difference of the conventional single-valued DRAM devices is $$V_{CC} - V_{CC}/2 = V_{CC}/2 - 0$$
$$= V_{CC}/2$$

then, the acceptable minimum difference of the device of FIG. 1 is $$2V_{CC}/3 - V_{CC}/2 = V_{CC}/2 - V_{CC}/3$$
$$= V_{CC}/6$$

Thus, $V_{CC}/2/(V_{CC}/6)=3$.

If three single-valued memory cells each having an area of 2×2 with a capacitance area of 1×1 as illustrated in FIG. 4A are combined into a four-valued memory cell having an area of 2×4 with a capacitance area of 1×3 as illustrated in FIG. 4B, a memory cell with three times as large a capacitance cell can be realized. In this case, however, the area of one four-valued memory cell is the same as that of two bits of the single-valued memory cells, and therefore, such a four-valued memory cell as illustrated in FIG. 4B is not advantageous over the single-valued memory cell as illustrated in FIG. 4A.

On the other hand, in a memory cell having an area of (1+$\sqrt{3}$)×(1+$\sqrt{3}$) with a capacitance area of $\sqrt{3}$×$\sqrt{3}$ as illustrated in FIG. 4C, the area of a memory cell array can be reduced by about 7 percent while maintaining the same capacitance area as compared with the memory cell as illustrated in FIG. 4B.

Figure 5A:
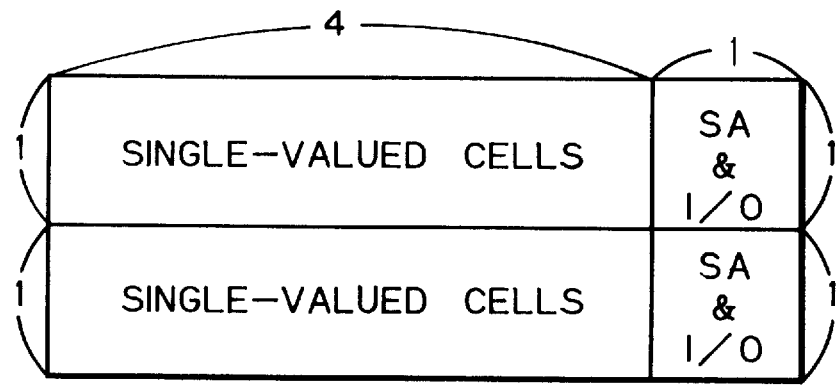
FIGS. 5A and 5B are plan views for explaining the area of the device of FIG. 1.
Figure 5B:
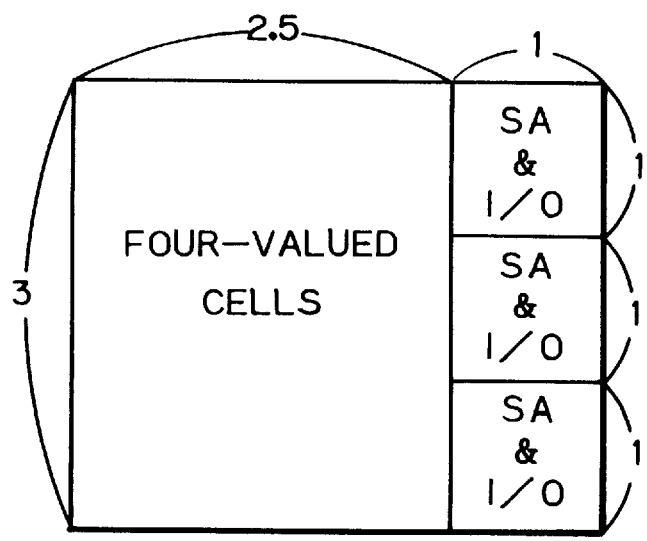

However, even if memory cells as illustrated in FIG. 4C are adopted in the device of FIG. 1, since three sense amplifiers are provided for one bit line pair, the chip area is still larger than the conventional single-valued devices. That is, if a single-valued DRAM device adopting the configuration of FIG. 4A is constructed by one sense amplifier (SA)

including one column selection circuit (I/O) per one bit line pair, a four-valued DRAM device adoping the configuration of FIG. 4C in the device of FIG. 1 can be constructed as illustrated in FIG. 5B to correspond to the device of FIG. 5A, In this case, an area of the device of FIG. 5A is $$(4 \times 1) \times 2 + (1 \times 1) \times 2 = 10$$

On the other hand, an area of the device of FIG. 5B is $$7.5 + (1 \times 1) \times 3 = 10.5$$

Thus, the four-valued device as illustrated in FIG. 5B is not advantageous over the single-valued device as illustrated in FIG. 5A.

Figure 6:
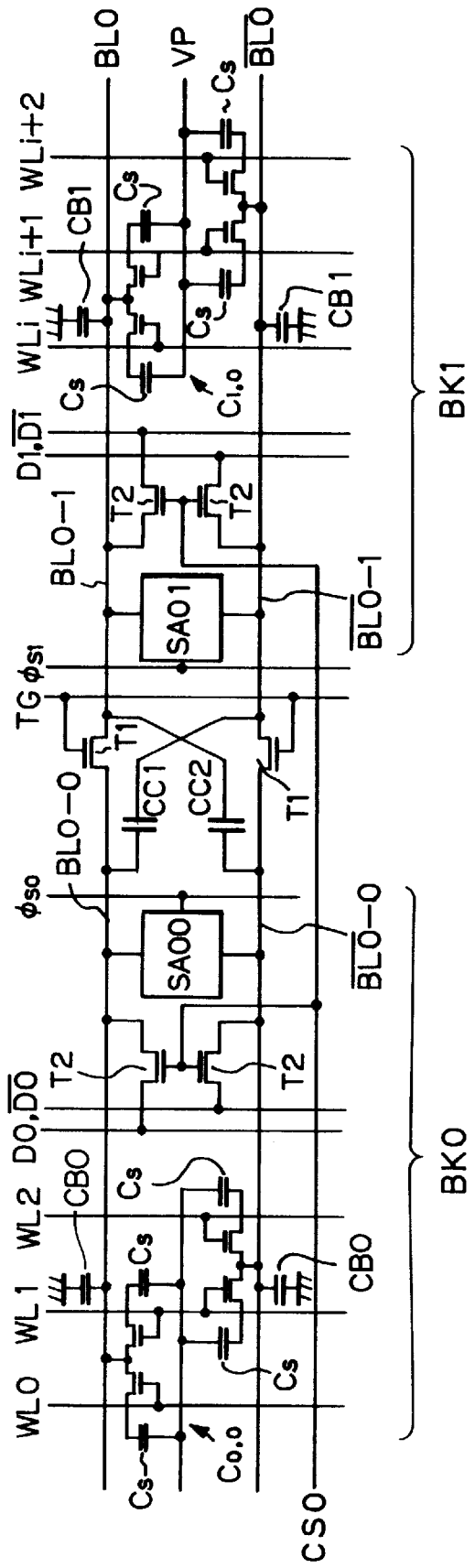
FIG. 6 is a circuit diagram illustrating a first embodiment of the multi-valued DRAM device according to the present invention.

In FIG. 6, which illustrates a first embodiment of the present invention, only one pair of bit lines BL0 and $\overline{BL0}$ are illustrated; the other bit lines are omitted for simplifying the description.

The bit lines BL0 and $\overline{BL0}$ are divided into two blocks BK0 and BK1 which are electrically separated by transfer gates T1 controlled by a gate selection signal TG. For example, the bit line BL0 is divided into divided bit lines BL0-1 and $\overline{BL0}$-1 for the blocks BK0 and BK1, respectively. In this case, the stray capacitance CB1 of each of the divided bit lines BL0-1 and $\overline{BL0}$-1 is twice the stray capacitance CB0 of each of the divided bit lines BL0-0 and $\overline{BL0}$-0. For realizing this, for example, the number of word lines WL0, WL1, ... in the block BK0 is half of the number of word lines WLi, WLi+1, ... in the block BK1, so that the length of the divided bit lines BL0-0 and $\overline{BL0}$-0 is substantially half of that of the divided bit lines BL0-1 and $\overline{BL0}$-1.

A coupled capacitor CC1 is connected between the divided bit lines BL0-0 and $\overline{BL0}$-1, and a coupled capacitor CC2 is connected to the divided bit lines BL0-1 and $\overline{BL0}$-0.

Also, the dummy memory cells $DC_{0,0}, DC_{0,1}, \ldots, DC_{5,1}$ of FIG. 1 are not provided.

In the block BK0, memory cells $CC_{0,0}$ are provided at intersections between the word lines WL0, WL1, ... and the divided bit lines BL0-0 and $\overline{BL0}$-0, and a sense amplifier SA00 is connected to the divided bit lines BL0-0 and $\overline{BL0}$-0.

In the block BK1, memory cells $CC_{i,0}$ are provided at intersections between the word lines WLi, WLi+1, ... and the divided bit lines BL0-1 and $\overline{BL0}$-1, and a sense amplifier SA01 is connected to the divided bit lines BL0-1 and $\overline{BL0}$-1.

Thus, only two sense amplifiers are provided for one bit line pair.

The memory cells $C_{00}, \ldots, C_{i,0}, \ldots,$ are of a one transistor, one-capacitor type whose capacitance is denoted by $C_S$.

The divided bit lines BL0-0 and $\overline{BL0}$-0 are connected to data lines D0 and $\overline{D0}$, respectively, by transfer gates T2 controlled by a column selection signal CS0. Also, the divided bit lines BL0-1 and $\overline{BL0}$-1 are connected to data lines D1 and $\overline{D1}$, respectively, by transfer gates T2 controlled by the column selection signal CS0.

Figure 7:
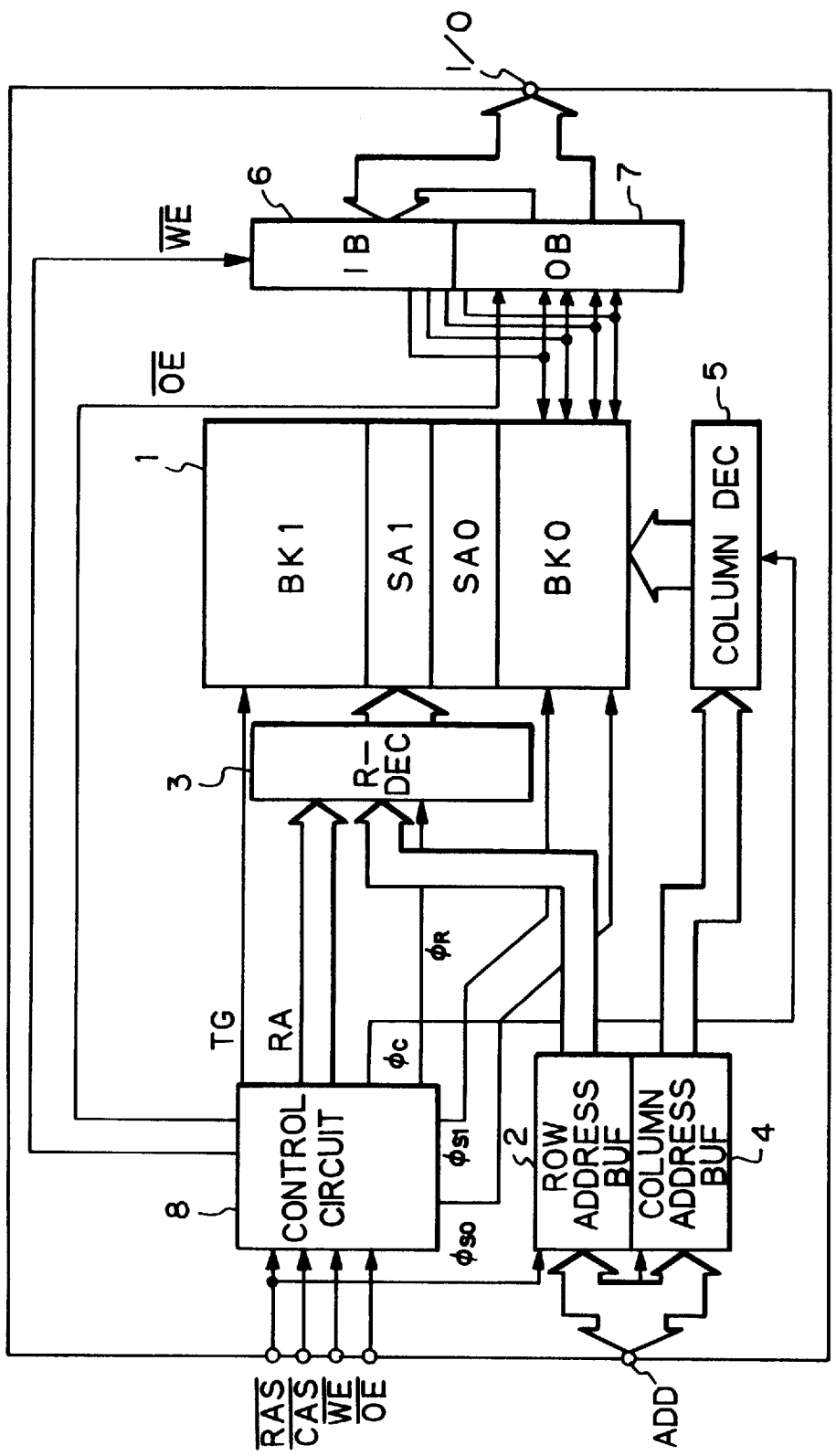
FIG. 7 is a block circuit diagram illustrating a DRAM device incorporating the circuit of FIG. 6.

The circuit of FIG. 6 is incorporated into a DRAM device as illustrated in FIG. 7.

In FIG. 7, reference numeral 1 designates a memory cell array which is divided into the blocks BK0 and BK1. Two columns of sense amplifiers SA0 (SA00, SA10, ...) and SA1 (SA01, SA11, ...) are incorporated into the memory cell array 1.

A row component of an address signal ADD is supplied via a row address buffer 2 to a row decoder 3. Similarly, a column component of the address signal ADD is supplied via a column address buffer 4 to a column decoder 5. The memory cell array 1 is accessed by the row decoder 3 and the column decoder 5. As a result, data is written from an input/output terminal I/O via a data input buffer 6 into the memory cell array 1. Otherwise, data is read from the memory cell array 1 via a data output buffer 7 to the input/output terminal I/O.

A control circuit 8 receives control signals such as an inverted signal of a row address strobe signal RAS, an inverted signal of a column address strobe signal CAS, an inverted signal of a write enable signal WE and an inverted signal of an output enable signal OE to control the entire device of FIG. 7.

Figures 8A, 8B:
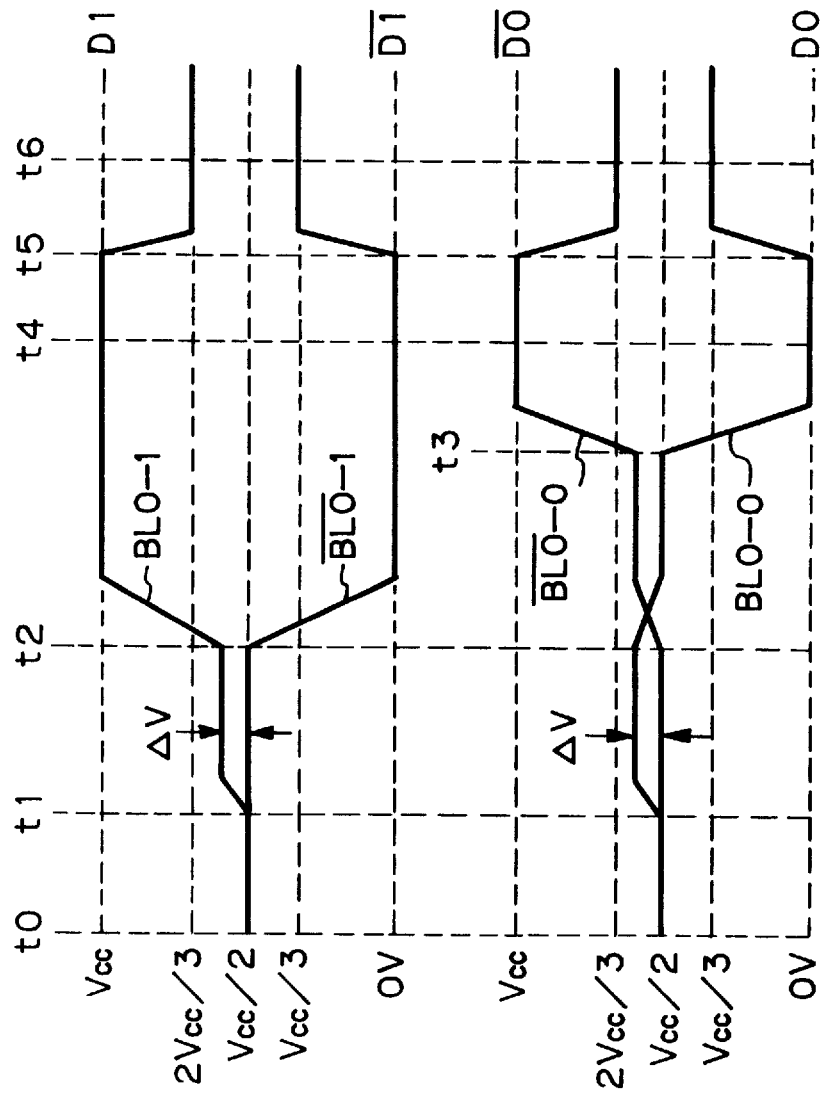
FIGS. 8A, 8B; 9A, 9B; 10A, 10B; and 11A, 11B are timing diagrams showing the read operation of the devices of FIGS. 6 and 7.

The read operation of the device of FIGS. 6 and 7 is explained with reference to FIGS. 8A and 8B. Here, assume that information corresponding to $2 V_{CC}/3=(1,0)$ is stored in the memory cell $C_{0,0}$.

First, at time t0, the voltage of the gate selection signal TG is made high, so that the bit lines BL0 and $\overline{BL0}$ are electrically connected over the blocks BK0 and BK1. Also, the bit lines BL0 and $\overline{BL0}$ are precharged by precharging transistors (not shown) to $V_{CC}/2$.

Next, at time t1, the inverted signal of the row address strobe signal RAS is made active (low). As a result, the precharging operation for the bit lines BL0 and $\overline{BL0}$ is stopped. Also, the address signal ADD is latched in the row address buffer 2 and the column address buffer 7. A row component of the address signal ADD is immediately supplied from the row address buffer 2 to the row decoder 3, and the control circuit 8 generates a row activation signal $\phi_R$ and transmits it to the row decoder 3. Therefore, the row decoder 3 selects one of the word lines which is in this case the word line WL0. As a result, the voltage at the bit line BL0, i.e., at the divided bit lines BL0-0 and $\overline{BL0}$-1 is increased by $\Delta V$ as shown in FIGS. 8A and 8B. In this case, the voltage at the bit line $\overline{BL0}$, i.e., at the divided bit lines $\overline{BL0}$-0 and $\overline{BL0}$-1 remains at $V_{CC}/2$. Then, the voltage of the gate selection signal TG is made low to turn OFF the transfer gates T1, so that the divided bit lines $\overline{BL0}$-0 and $\overline{BL0}$-0 are electrically separated from the divided bit lines BL0-1 and $\overline{BL0}$-1, 'respectively.

Next, at time t2, the control circuit 8 generates a sense activation signal $\phi_{S1}$ and transmits it to the sense amplifiers SA1(SA01). As a result, as shown in FIG. 8A, the difference in potential between the divided bit lines BL0-1 and $\overline{BL0}$-1 is increased. That is, the voltage at the divided bit line BL0-1 is increased to $V_{CC}$, and the voltage at the divided bit line $\overline{BL0}$-1 is decreased to 0 V.

When the voltages at the divided bit lines BL0-1 and $\overline{BL0}$-1 are changed, the voltages at the divided bit lines BL0-0 and $\overline{BL0}$-0 are also changed in an opposite direction thereto due to the capacitive coupling of the coupled capacitors CC1 and CC2. That is, as shown in FIGS. 8A and 8B, the voltage at the divided bit line BL0-0 is decreased by $\Delta V$, and the voltage at the divided bit line $\overline{BL0}$-0 is increased by $\Delta V$.

Next, at time t3, the control circuit 8 generates a sense activation signal $\phi_{S0}$ and transmits it to the sense amplifiers SA0(SA00). As a result, as shown in FIG. 8B, the difference in potential between the divided bit lines BL0-0 and $\overline{BL0}$-0 is increased. That is, the voltage at the divided bit line $\overline{BL0}$-0 is increased to $V_{CC}$, and the voltage at the divided bit line BL0-0 is decreased to 0 V.

Next, at time t4, the inverted signal of the column address strobe signal CAS is made active (low), so that a column component of the address signal ADD is supplied from the column address buffer 4 to the column decoder 5. Also, the control circuit 8 generates a column activation signal $\phi_C$ and transmits it to the column decoder 5. Therefore, the column decoder 5 selects one of column selection signals which is in this case CS0, to turn ON the transfer gates T2. As a result, the data at the divided bit lines BL0-0 and $\overline{BL0}$-0 are transmitted via the data lines D0 and $\overline{D0}$ to the data output buffer 7, and the data at the divided bit lines BL1-0 and $\overline{BL1}$-0 are transmitted via the data lines D1 and $\overline{D1}$ to the data output buffer 7. In this case, the data output buffer 7 is activated by the inverted signal of the output enable signal OE to generate data (D1, D0) denoted by $$(D1, D0) = (H, L)$$
$$= (1, 0)$$

Then, the sense activation signals $\phi_{S0}$ and $\phi_{S1}$ are made low to deactivate the sense amplifiers SA0(SA00) and SA1(SA10).

Next, at time t5, the control circuit 8 makes the gate selection signal TG active (high), so that the divided bit lines BL0-0 and $\overline{BL0}$-0 are electrically connected to the divided bit lines BL0-1, and $\overline{BL0}$-1, respectively. Therefore, charges are transferred from the divided bit lines BL0-0 and $\overline{BL0}$-0 to the divided bit lines BL0-1 and $\overline{BL0}$-1, respectively, or vice versa, and as a result, the voltages at the divided bit lines BL0-0 and $\overline{BL0}$-0 conform to the voltages at the divided bit lines BL0-1 and $\overline{BL0}$-1, respectively. In this case, since CB0/CB1=1/2, the voltage V(BL0) at the divided bit line BL0-0 is $$V(BL0) = (CB1 \times V_{CC} + CB0 \times 0V)/$$
$$(CB0 + CB1)$$
$$= 2V_{CC}/3$$

Thus, the voltage at the bit line BL-0 connected to the memory cell $C_{0, 0}$ is restored.

Finally, at time t6, the row activation signal $\phi_R$ is made low to deactivate the row decoder 3, thus completing a restoring operation of $2 V_{CC}/3$ upon the memory cell $C_{0, 0}$. Then, the column activation signal $\phi_C$ is made low to deactivate the column decoder 5.

If information corresponding to $V_{CC}/3=(0, 1)$ is stored in the memory cell $C_{0, 0}$, the read operation of the device of FIGS. 6 and 7 is as explained below with reference to FIGS. 9A and 9B.

First, at time t0, the bit lines BL0 and $\overline{BL0}$ are electrically connected over the blocks BK0 and BK1. Also, the bit lines BL0 and $\overline{BL0}$ are precharged to $V_{CC}/2$.

Figures 9A, 9B:
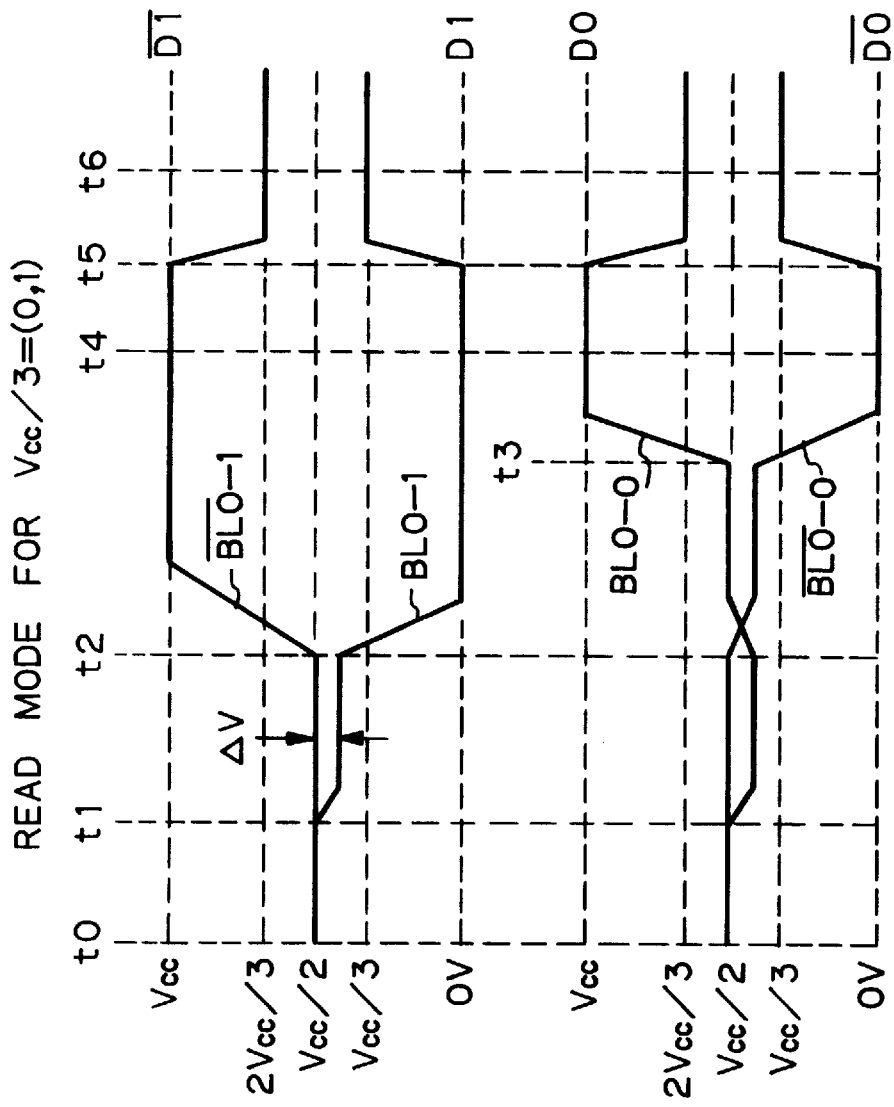

Next, at time t1, the voltage at the bit line BL0, i.e., at the divided bit lines BL0-0 and BL0-1 is decreased by $\Delta V$ as shown in FIGS. 9A and 9B. In this case, the voltage at the bit line $\overline{BL0}$, i.e., at the divided bit lines $\overline{BL0}$-0 and $\overline{BL0}$-1 remains at $V_{CC}/2$. Then, the divided bit lines BL0-0 and $\overline{BL0}$-0 are electrically separated from the divided bit lines BL0-1 and $\overline{BL0}$-1, respectively.

Next, at time t2, as shown in FIG. 9A, the difference in potential between the divided bit lines $\overline{BL0}$-1 and BL0-1 is increased. That is, the voltage at the divided bit line $\overline{BL0}$-1 is increased to $V_{CC}$, and the voltage at the divided bit line BL0-1 is decreased to 0 V.

Also, due to the capacitive coupling of the coupled capacitors CC1 and CC2, as shown in FIGS. 9A and 9B, the divided bit line BL0-1 is decreased by $\Delta V$, and the voltage at the bit line $\overline{BL0}$-1 is decreased by $\Delta V$.

Next, at time t3, as shown in FIG. 9B, the difference in potential between the divided bit lines BL0-0 and $\overline{BL0}$-0 is increased. That is, the voltage at the divided bit line BL0-0 is increased to $V_{CC}$, and the voltage at the divided bit line $\overline{BL0}$-0 is decreased to 0 V.

Next, at time t4, the data at the divided bit lines BL0-0 and $\overline{BL0}$-0 are transmitted via the data lines D0 and $\overline{D0}$ to the data output buffer 7, and the data at the divided bit lines BL0-1 and $\overline{BL0}$-1 are transmitted via the data lines D1 and $\overline{D1}$ to the data output buffer 7. In this case, the data output buffer 7 is activated by the inverted signal of the output enable signal OE to generate data (D1, D0) denoted by $$(D1, D0) = (L, H)$$
$$= (0, 1)$$

Next, at time t5, the divided bit lines BL0-0 and $\overline{BL0}$-0 are electrically connected to the divided bit lines BL0-1, and $\overline{BL0}$-1, respectively. Therefore, charges are transferred from the divided bit; lines BL0-0 and $\overline{BL0}$-0 to the divided bit lines BL0-1 and $\overline{BL0}$-1 or vice versa, and as result, the voltages at the divided bit lines BL0-0 and $\overline{BL0}$-0 conform to the voltages at the divided bit lines BL0-1 and $\overline{BL0}$-1, respectively. In this case, since CB0/CB1=1/2, the voltage V(BL0) at the divided bit line BL0-0 is $$V(BL0) = (CB1 \times 0V + CB0 \times V_{CC})/$$
$$(CB0 + CB1)$$
$$= V_{CC}/3$$

Thus, the voltage at the bit line BL-0 connected to the memory cell $C_{0, 0}$ is restored.

Finally, at time t6, a restoring operation of $V_{CC}/3$ upon the memory cell $C_{0, 0}$ is completed.

If information corresponding to 0 V (0,0) is stored in the memory cell $C_{0, 0}$ the read operation of the device of FIGS. 6 and 7 is as explained below with reference to FIGS. 10A and 10B.

First, at Lime t0, the bit lines BL0 and $\overline{BL0}$ are electrically connected over the blocks BK0 and BK1. Also, the bit lines BL0 and $\overline{BL0}$ are precharged to $V_{CC}/2$.

Next, at time t1, the voltage at the bit line BL0, i.e., at the divided bit lines BL0-0 and BL0-1 is decreased by $3 \Delta V$ as shown in FIGS. 10A and 10B. In this case, the voltage at the bit line $\overline{BL0}$, i.e., at the divided bit lines $\overline{BL0}$-0 and $\overline{BL0}$-1 remains at $V_{CC}/2$. Then, the divided bit lines BL0-0 and $\overline{BL0}$-0 are electrically separated from the divided bit lines BL0-1 and $\overline{BL0}$-1.

Next, at time t2, as shown in FIG. 10A, the difference in potential between the divided bit lines BL0-1 and $\overline{BL0}$-1 is increased. That is, the voltage at the divided bit line $\overline{BL0}$-1 is increased to $V_{CC}$, and the voltage at the divided bit line BL0-1 is decreased to 0 V.

Also, due to the capacitive coupling of the coupled capacitors CC1 and CC2, as shown in FIGS. 10A and 10B, the voltage at the divided bit line BL0-0 is increased by $\Delta V$, and the voltage at the divided bit line $\overline{BL0}$-0 is decreased by $\Delta V$. In this case, note that the relationship between the voltages at the divided bit lines $\overline{BL0}$-0 and BL,O-0 are not reversed.

Next, at time t3, as shown in FIG. 10B, the difference in potential between the divided bit lines BL0-0 and $\overline{BL0}$-0 is increased. That is, the voltage at the divided bit line $\overline{BL0}$-0 is increased to $V_{CC}$, and the voltage at the divided bit; line BL0-0 is decreased to 0 V.

Next, at time t4, the data at the divided bit lines BL0-0 and BL0-0 are transmitted via the data lines D0 and $\overline{D0}$ to the data output buffer 7, and the data at the divided bit lines BL0-1 and $\overline{BL0}$-1 are transmitted via the data lines D1 and $\overline{D1}$ to the data output buffer 7. In this case, the data output buffer 7 is activated by the inverted signal of the output enable signal OE to generate data (D1, D0) denoted by $$(D1, D0) = (L, L)$$
$$= (0, 0)$$

Next, at time t5, the divided bit lines BL0-0 and $\overline{BL0}$-0 are electrically connected to the divided bit lines BL0-1, and $\overline{BL0}$-1, respectively. As result, the voltages at the divided bit lines BL0-0 and $\overline{BL0}$-0 conform to the voltages at the divided bit lines BL0-1 and $\overline{BL0}$-1, respectively. In this case, the voltage V(BL0) at the divided bit line BL0-0 is $$V(BL0) = (CB1 \times 0V + CB0 \times 0V)/$$
$$(CB0 + CB1)$$
$$= 0V$$

Thus, the voltage at the bit line BL-0 connected to the memory cell $C_{0,0}$ is restored.

Finally, at time t6, a restoring operation of 0 V upon the memory cell $C_{0,0}$ is completed.

If information corresponding to $V_{CC}$=(1,1) is stored in the memory cell $C_{0,0}$, the read operation of the device of FIGS. 6 and 7 is as explained below with reference to FIGS. 11A and 11B.

First, at time t0, the bit lines BL0 and $\overline{BL0}$ are electrically connected over the blocks BK0 and BK1. Also, the bit lines BL0 and $\overline{BL0}$ are precharged to $V_{CC}/2$.

Figures 11A, 11B:
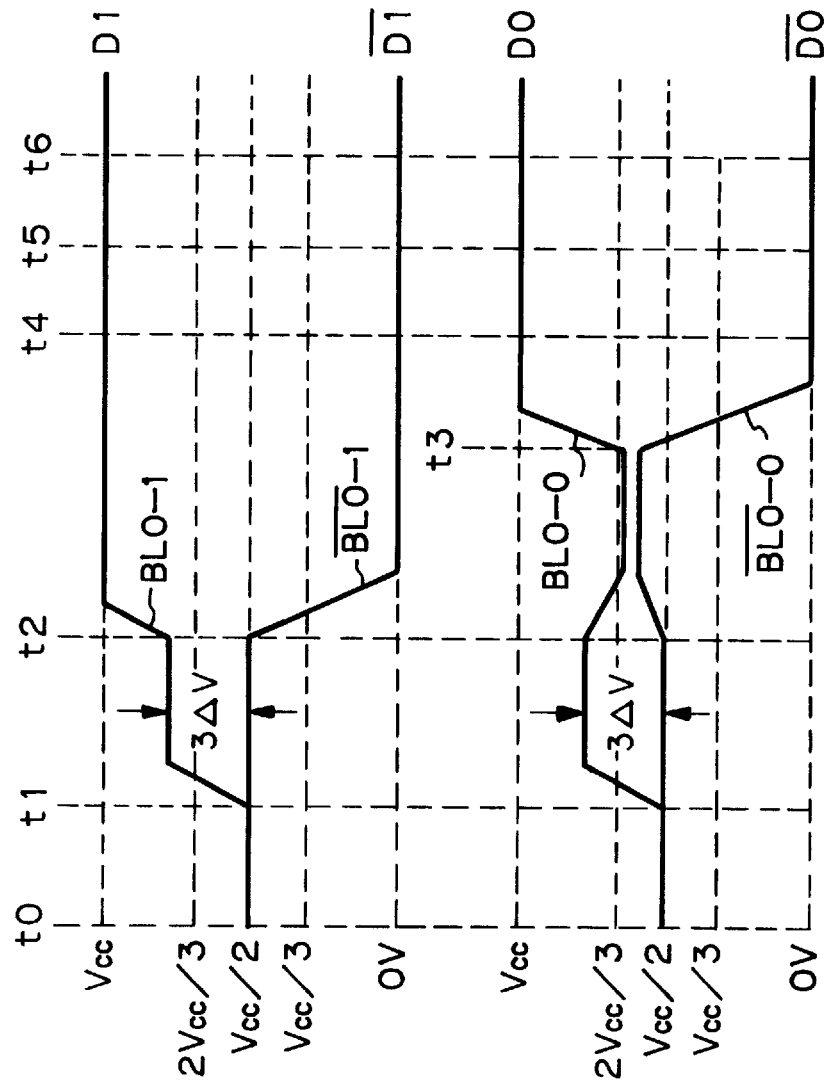

Next, at time t1, the voltage at the bit line BL0, i.e., at the divided bit lines BL0-0 and BL0-1 is increased by 3 ΔV as shown in FIGS. 11A and 11B. In this case, the voltage at the bit line $\overline{BL0}$, i.e., at the divided bit lines $\overline{BL0}$-0 and $\overline{BL0}$-1 remains at $V_{CC}/2$. Then, the divided bit lines BL0-0 and $\overline{BL0}$-0 are electrically separated from the divided bit lines BL0-1 and $\overline{BL0}$-1.

Next, at time t2, as shown in FIG. 11A, the difference in potential between the divided bit lines BL0-1 and $\overline{BL0}$-1 is increased. That is, the voltage at the divided bit line BL0-1 is increased to $V_{CC}$, and the voltage at the divided bit line $\overline{BL0}$-1 is decreased to 0 V.

Also, due to the capacitive coupling of the coupled capacitors CC1 and CC2, as shown in FIGS. 11A and 11B, the voltage at the divided bit line BL0-1 is decreased by ΔV, and the voltage at the divided bit line $\overline{BL0}$-0 is increased. In this case, note that the relationship between the voltages at the divided bit lines BL0-0 and $\overline{BL0}$-0 are not reversed.

Next, at time t3, as shown in FIG. 11B, the difference in potential between the divided bit lines BL0-0 and $\overline{BL0}$-0 is increased. That is, the voltage at the divided bit line BL0-0 is increased to $V_{CC}$, and the voltage at the divided bit line $\overline{BL0}$-0 is decreased to 0 V.

Next, at time t4, the data at the divided bit lines BL0-0 and $\overline{BL0}$-0 are transmitted via the data lines D0 and $\overline{D0}$ to the data output buffer 7, and the data at the divided bit lines BL0-1 and $\overline{BL0}$-1 are transmitted via the data lines D1 and $\overline{D1}$ to the data output buffer 7. In this case, the data output buffer 7 is activated by the inverted signal of the output enable signal OE to generate data (D1, D0) denoted by $$(D1, D0) = (H, H)$$
$$= (1, 1)$$

Next, at time t5, the divided bit lines BL0-0 and $\overline{BL0}$-0 are electrically connected to the divided bit lines BL0-1, and $\overline{BL0}$-1, respectively. As result, the voltages at the divided bit lines BL0-0 and $\overline{BL0}$-0 conform to the voltages at the divided bit lines BL0-1 and $\overline{BL0}$-1, respectively. In this case, since CB0/CB1=1/2, the voltage V(BL0) at the divided bit line BL0-0 is $$V(BL0) = (CB1 \times V_{CC} + CB0 \times V_{CC})/$$
$$(CB0 + CB1)$$
$$= V_{CC}$$

Thus, the voltage at the bit line BL-0 connected to the memory cell $C_{0,0}$ is restored.

Finally, at time t6, a restoring operation of $V_{CC}$ upon the memory cell $C_{0,0}$ is completed.

Thus, in FIGS. 6 and 7, if D0 is a least significant bit (LSB) and D1 is a most significant bit (MSB), read data (D1, D0) is (0, 0), (0, 1), (1, 0) and (1, 1) when the memory cell $C_{0,0}$ stores "0" (0 V), "1" ($V_{CC}/3$), "2" (2 $V_{CC}/3$) and "3" ($V_{CC}$), respectively. That is, two bit data (D1, D0) can be directly generated without converting three-bit data into two-bit data.

Figures 12A, 12B:
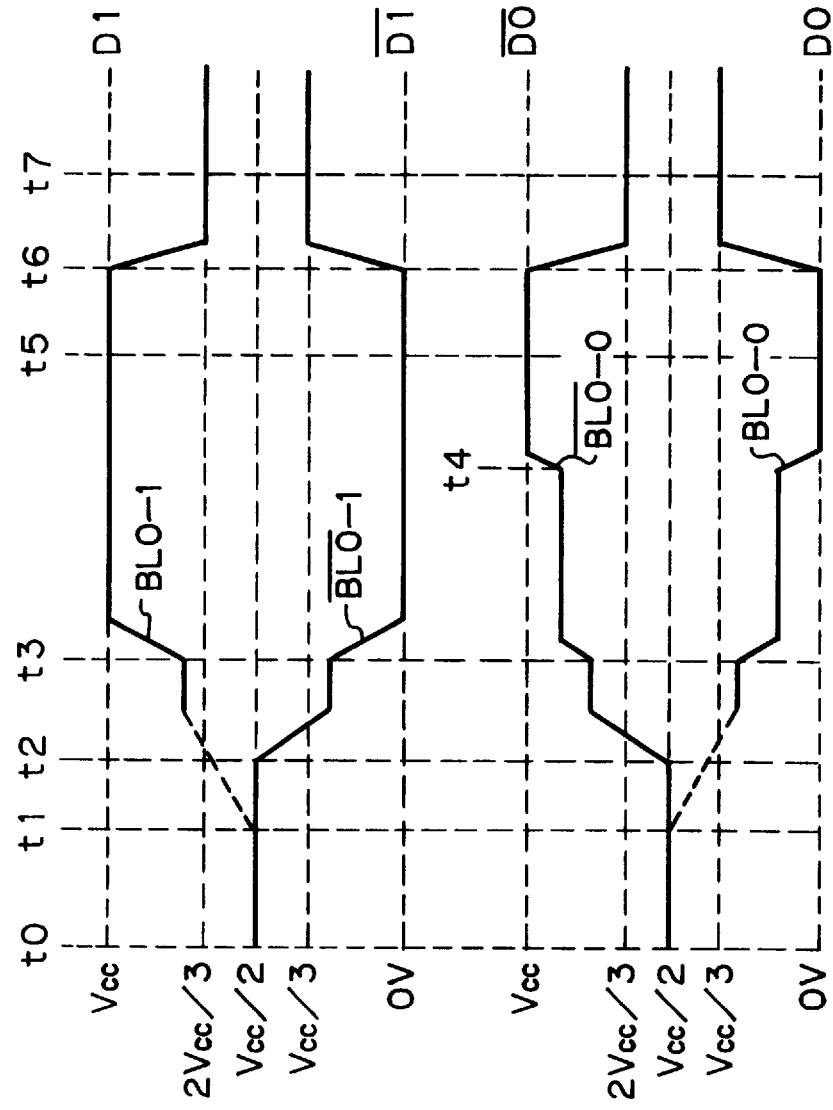
FIGS. 12A, 12B; 13A, 13B; 14A, 14B; and 15A, 15B are timing diagrams showing the read operation of the devices of FIGS. 6 and 7.

The write operation of the device of FIGS. 6 and 7 is explained next with reference to FIGS. 12A and 12B. Here, assume that information corresponding to 2 $V_{CC}/3$=(1, 0) will be written into the memory cell $C_{0,0}$.

First, at time t0, the voltage of the gate selection signal TG is made high, so that the bit lines BL0 and $\overline{BL0}$ are electrically connected over the blocks BK0 and BK1. Also, the bit lines $\overline{BL0}$ and $\overline{BL0}$ are precharged by the precharging transistors to $V_{CC}/2$.

Next, at time t1, the inverted signal of the row address strobe signal RAS is made active (low). As a result, the precharging operation for the bit lines BL0 and $\overline{BL0}$ is stopped. Also, the address signal ADD is latched in the row address buffer 2 and the column address buffer 7. A row component of the address signal ADD is immediately supplied from the row address buffer 2 to the row decoder 3, and the control circuit 8 generates a row activation signal $\phi_R$ and transmits it to the row decoder 3. Therefore the row decoder 3 selects one of the word lines which is in this case the word line WL0. As a result, the memory cell $C_{0,0}$ is connected to the bit line BL0. Therefore, the voltage at the bit line BL0, i.e., at the divided bit lines BL0-0 and BL0-1 is dependent upon data previously stored in the memory cell $C_{0,0}$, but the voltage at the bit line $\overline{BL0}$, i.e., at the divided bit lines $\overline{BL0}$-0 and $\overline{BL0}$-1 remains at $V_{CC}/2$. Then, when the inverted signal of the write enable signal WE is made active (low), the control circuit 8 makes the voltage of the gate selection signal TG low to turn OFF the transfer gates T1, so that the divided bit lines BL0-0 and $\overline{BL0}$-0 are electrically separated from the divided bit lines BL0-1 and $\overline{BL0}$-1, respectively. Also, the data input buffer 6 latches data and outputs it to the data lines D0, $\overline{D0}$, D1 and $\overline{D1}$. In this case, $$(D1, D0) = (1, 0)$$
$$= (V_{CC}, 0V)$$

Next, at time t2, the inverted signal of the column address strobe signal CAS is made active (low), so that a column component of the address signal ADD is supplied from the column address buffer 4 to the column decoder 5. Also, the control circuit 8 generates a column activation signal $\phi_C$ and transmits it to the column decoder 5. Therefore, the column decoder 5 selects one of column selection signals which is in this case CS0, to turn ON the transfer gates T2. As a result, the data at the data lines D0 and $\overline{D0}$ are transmitted to the divided bit lines BL0-0 and $\overline{BL0}$-0, respectively, and the data at the data lines D1 and $\overline{D1}$ are transmitted to the divided bit lines BL0-1 and $\overline{BL0}$-1, respectively.

Next, at time t3, the control circuit 8 generates a sense activation signal $\phi_{S1}$ and transmits it to the sense amplifiers SA1 (SA01). As a result, as shown in FIG. 12A, the difference in potential between the divided bit lines B10-1 and $\overline{BL0}$-1 is increased. That is, the voltage at the divided bit line BL0-1 is increased to $V_{CC}$, and the voltage at the divided bit line $\overline{BL0}$-1 is decreased to 0 V.

When the voltages at the divided bit lines BL0-1 and $\overline{BL0}$-1 are changed, the voltages at the divided bit lines BL0-0 and $\overline{BL0}$-0 are also changed in an opposite direction thereto due to the capacitive coupling of the coupled capacitors CC1 and CC2. That is, as shown in FIGS. 12A and 12B, the voltage at the divided bit line BL0-0 is decreased, and the voltage at the divided bit line $\overline{BL0}$-0 is increased.

Next, at time t4, the control circuit 8 generates a sense activation signal $\phi_{S0}$ and transmits it to the sense amplifiers SA0 (SA00). As a result, as shown in FIG. 12B, the difference in potential between the divided bit lines BL0-0 and $\overline{BL0}$-0 is increased. That is, the voltage at the divided bit line BL0-0 is decreased to $V_{CC}$, and the voltage at the divided bit line $\overline{BL0}$-0 is increased to 0 V.

Then, the sense activation signals $\phi_{S0}$ and $\phi_{S1}$ are made low to deactivate the sense amplifiers SA0(SA00) and SA1(SA10).

Next, at time t6, the control circuit 8 makes the gate selection signal TG active (high), so that the divided bit lines BL0-0 and $\overline{BL0}$-0 are electrically connected to the divided bit lines BL0-1 and $\overline{BL0}$-1, respectively. Therefore, charges are transferred from the divided bit lines BL0-0 and $\overline{BL0}$-0 to the divided bit lines BL0-1 and $\overline{BL0}$-1 or vice versa, and as a result, the voltages at the divided bit lines BL0-0 and $\overline{BL0}$-0 conform to the voltages at the divided bit lines BL0-1 and $\overline{BL0}$-1, respectively. In this case, since CB0/CB1=1/2, the voltage V(BL0) at the divided bit line BL0-0 is $$V(BL0) = (CB1 \times V_{CC} + CB0 \times 0V)/(CB0+CB1)$$
$$= 2V_{CC}/3$$

Thus, the voltage at the bit line BL-0 connected to the memory cell $C_{0,0}$ is caused to be 2 $V_{CC}/3$.

Finally, at time t7, the row activation signal $\phi_R$ is made low to deactivate the row decoder 3, thus completing a writing operation of 2 $V_{CC}/3$ upon the memory cell $C_{0,0}$. Then, the column activation signal $\phi_C$ is made low to deactivate the column decoder 5.

If information corresponding to $V_{CC}/3$=(0, 1) is written into the memory cell $C_{0,0}$, the write operation of the device of FIGS. 6 and 7 is as explained below with reference to FIGS. 13A and 13B.

First, at time t0, the bit lines BL0 and $\overline{BL0}$ are electrically connected over the blocks BK0 and BK1. Also, the bit lines BL0 and $\overline{BL0}$ are precharged to $V_{CC}/2$.

Next, at time t1, the memory cell $C_{0,0}$ is connected to the bit line BL0. Therefore, the voltage at the bit line BL0, i.e., at the divided bit lines BL0-0 and BL0-1 is dependent upon data previously stored in the memory cell $C_{0,0}$, but the voltage at the bit line $\overline{BL0}$, i.e., at the divided bit lines $\overline{BL0}$-0 and $\overline{BL0}$-1 remains at $V_{CC}/2$. Then, the divided bit lines BL0-0 and $\overline{BL0}$-0 are electrically separated from the divided bit lines BL0-1 and $\overline{BL0}$-1, respectively. Also, the data input buffer 6 latches data and outputs it to the data lines D0, $\overline{D0}$, D1 and $\overline{D1}$. In this case, $$(D1, D0) = (0, 1)$$
$$= (0V, V_{CC})$$

Next, at time t2, the data at the data lines D0 and $\overline{D0}$ are transmitted to the divided bit lines BL0-0 and $\overline{BL0}$-0, respectively, and the data at the data lines D1 and $\overline{D1}$ are transmitted to the divided bit lines BL0-1 and $\overline{BL0}$-1, respectively.

Figures 13A, 13B:
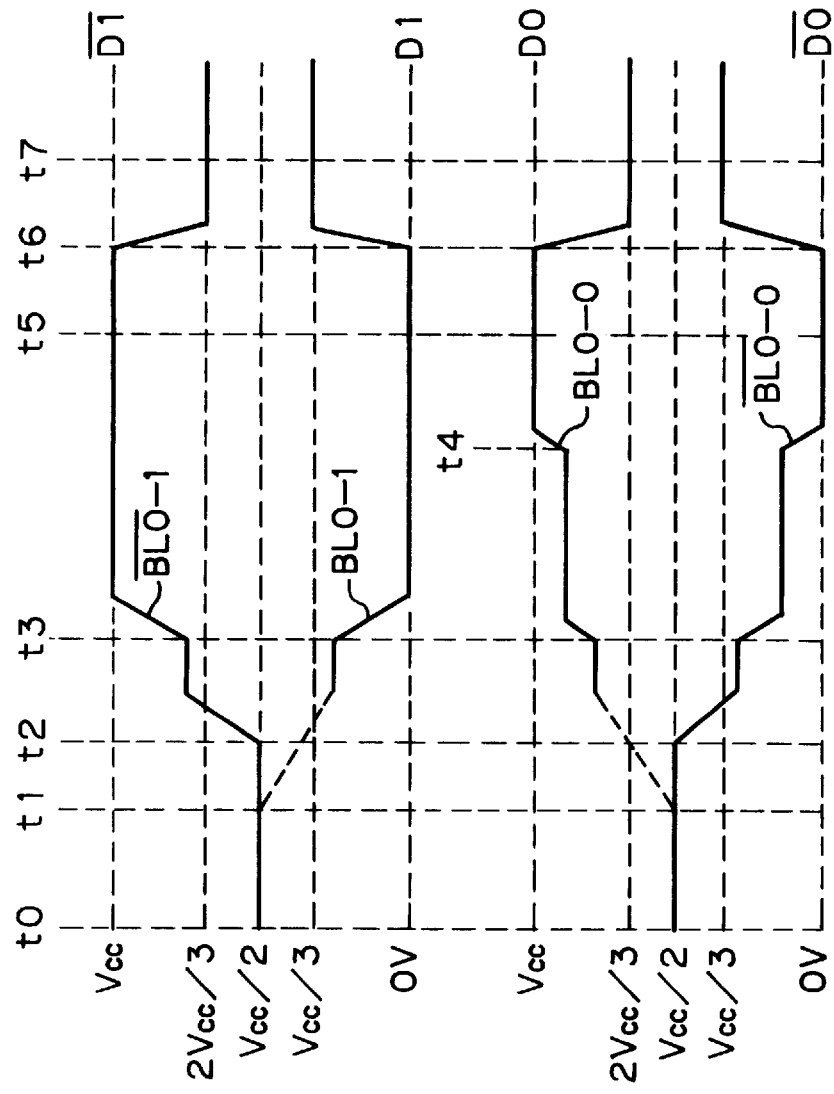

Next, at time t3, as shown in FIG. 13A, the difference in potential between the divided bit lines BL0-1 and $\overline{BL0}$-1 is increased. That is, the voltage at the divided bit line $\overline{BL0}$-1 is increased to $V_{CC}$, and the voltage at the divided bit line BL0-1 is decreased to 0 V.

When the voltages at the divided bit lines BL0-1 and $\overline{BL0}$-1 are changed, the voltages at the divided bit lines BL0-0 and $\overline{BL0}$-0 are also changed in an opposite direction thereto due to the capacitive coupling of the coupled capacitors CC1 and CC2. That is, as shown in FIGS. 13A and 13B, the divided bit line BL0-0 is increased, and the voltage at the voltage at the divided bit line $\overline{BL0}$-0 is decreased.

Next, at time t4, as shown in FIG. 13B, the difference in potential between the divided bit lines BL0-0 and $\overline{BL0}$-0 is increased. That is, the voltage at the divided bit line $\overline{BL0}$-0 is increased to $V_{CC}$, and the voltage at the divided bit line BL0-0 is decreased to 0 V.

Next, at time t6, the divided bit lines BL0-0 and $\overline{BL0}$-0 are electrically connected to the divided bit lines BL0-1 and $\overline{BL0}$-1, respectively. Therefore, charges are transferred from the divided bit lines BL0-0 and $\overline{BL0}$-0 to the divided bit lines BL0-1 and $\overline{BL0}$-1 or vice versa, and as a result, the voltages at the divided bit lines BL0-0 and $\overline{BL0}$-0 conform to the voltages at the divided bit lines BL0-1 and $\overline{BL0}$-1, respectively. In this case, since CB0/CB1=1/2, the voltage V(BL0) at the divided bit line BL0-0 is $$V(BL0) = (CB1 \times 0V + CB0 \times V_{CC})/(CB0+CB1)$$
$$= V_{CC}/3$$

Thus, the voltage at the bit line BL-0 connected to the memory cell $C_{0,0}$ is caused to be $V_{CC}/3$.

Finally, at time t7, a writing operation of $V_{CC}/3$ upon the memory cell $C_{0,0}$ is completed.

If information corresponding to 0 V=(0, 0) is written into the memory cell $C_{0,0}$, the write operation of the device of FIGS. 6 and 7 is as explained below with reference to FIGS. 14A and 14B.

First, at time to, the bit lines BL0 and $\overline{BL0}$ are electrically connected over the blocks BK0 and BK1. Also, the bit lines BL0 and $\overline{BL0}$ are precharged to $V_{CC}/2$.

Next, at time t1, the memory cell $C_{0,0}$ is connected to the bit line BL0. Therefore, the voltage at the bit line BL0, i.e., at the divided bit lines BL0-0 and BL0-1 is dependent upon data previously stored in the memory cell $C_{0,0}$, but the voltage at the bit line $\overline{BL0}$, i.e., at the divided bit lines $\overline{BL0}$-0 and $\overline{BL0}$-1 remains at $V_{CC}/2$. Then, the divided bit lines BL0-0 and $\overline{BL0}$-0 are electrically separated from the divided bit lines BL0-1 and $\overline{BL0}$-1. Also, the data input buffer 6 latches data and outputs it to the data lines D0, $\overline{D0}$, D1 and $\overline{D1}$. In this case, $$(D1, D0) = (0, 0)$$
$$= (0V, 0V)$$

Next, at time t2, the data at the data lines D0 and $\overline{D0}$ are transmitted to the divided bit lines BL0-0 and $\overline{BL0}$-0, respectively, and the data at the data lines D1 and $\overline{D1}$ are transmitted to the divided bit lines BL0-1 and $\overline{BL0}$-1, respectively.

Figures 14A, 14B:
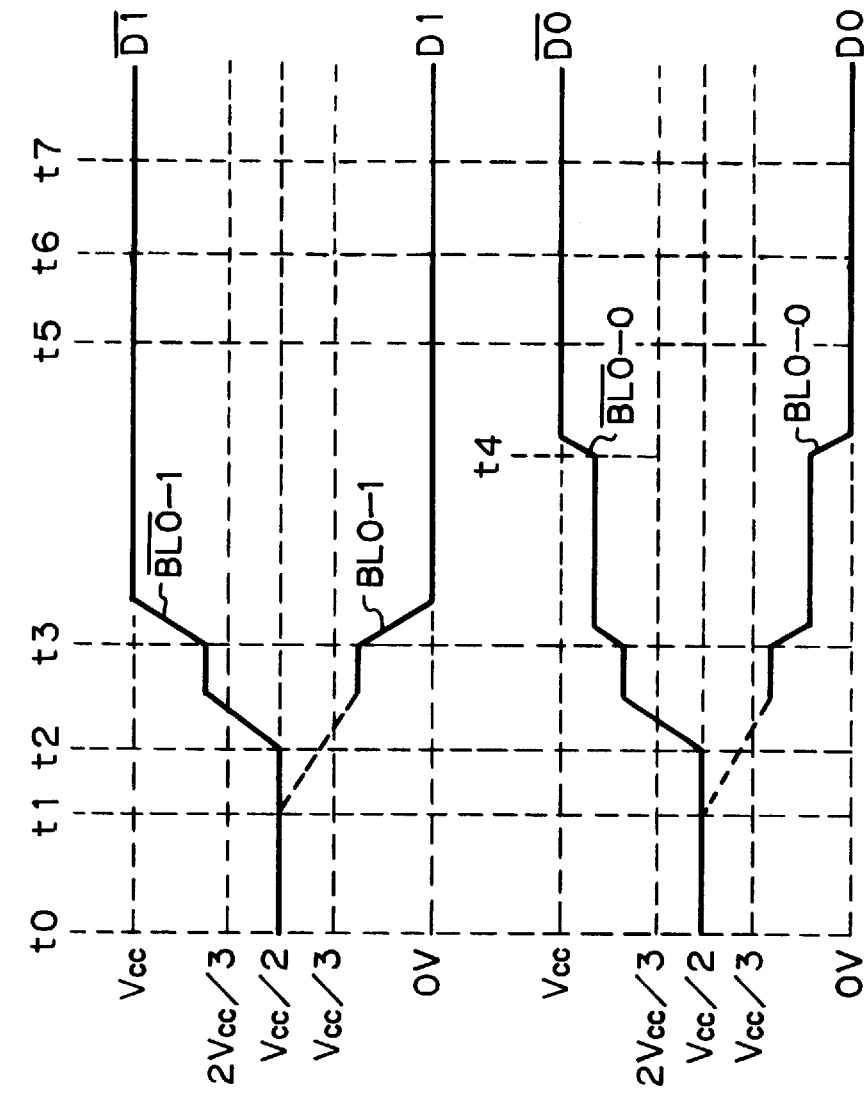

Next, at time t3, as shown in FIG. 14A, the difference in potential between the divided bit lines BL0-1 and $\overline{BL0}$-1 is increased. That is, the voltage at the divided bit line $\overline{BL0}$-1 is increased to $V_{CC}$, and the voltage at the divided bit line BL0-1 is decreased to 0 V.

When the voltages at the divided bit lines BL0-1 and $\overline{BL0}$-1 are changed, the voltages at the divided bit lines BL0-0 and $\overline{BL0}$-0 are also changed in an opposite direction thereto due to the capacitive coupling of the coupled capacitors CC1 and CC2. That is, as shown in FIGS. 14A and 14B, the voltage at the divided bit line BL0-0 is decreased, and the voltage at the divided bit line $\overline{BL0}$-0 is increased.

Next, at time t4, as shown in FIG. 14B, the difference in potential between the divided bit lines BL0-0 and $\overline{BL0}$-0 is increased. That is, the voltage at the divided bit line BL0-0 is decreased to $V_{CC}$, and the voltage at the divided bit line $\overline{BL0}$-0 is increased to 0 V.

Next, at time t6, the divided bit lines BL0-0 and $\overline{BL0}$-0 are electrically connected to the divided bit lines BL0-1 and $\overline{BL0}$-1, respectively. Therefore, charges are transferred from the divided bit lines BL0-0 and $\overline{BL0}$-0 to the divided bit lines BL0-1 and $\overline{BL0}$-1 or vice versa, and as a result, the voltages at the divided bit lines BL0-0 and $\overline{BL0}$-0 conform to the voltages at the divided bit lines BL0-1 and $\overline{BL0}$-1, respectively. In this case, since CB0/CB1=1/2, the voltage V (BL0) at the divided bit line BL0-0 is $$V(BL0) = (CB1 \times 0V + CB0 \times 0V)/(CB0 + CB1)$$
$$= 0V$$

Thus, the voltage at the bit line BL-0 connected to the memory cell $C_{0,\,0}$ is caused to be 0 V.

Finally, at time t7, a writing operation of 0 V upon the memory cell $C_{0,\,0}$ is completed.

If information corresponding to $V_{CC}$=(1, 1) is written into the memory cell $C_{0,\,0}$, the write operation of the device of FIGS. 6 and 7 is as explained below with reference to FIGS. 15A and 15B.

First, at time t0, the bit lines BL0 and $\overline{BL0}$ are electrically connected over the blocks BK0 and BK1. Also, the bit lines BL0 and $\overline{BL0}$ are precharged to $V_{CC}/2$.

Next, at time t1, the memory cell $C_{0,\,0}$ is connected to the bit line BL0. Therefore, the voltage at the bit line BL0, i.e., at the divided bit lines BL0-0 and BL0-1 is dependent upon data previously stored in the memory cell $C_{0,\,0}$, but the voltage at the bit line $\overline{BL0}$, i.e., at the divided bit lines $\overline{BL0}$-0 and $\overline{BL0}$-1 remains at $V_{CC}/2$. Then, the divided bit lines BL0-0 and $\overline{BL0}$-0 are electrically separated from the divided bit lines BL0-1 and $\overline{BL0}$-1, respectively. Also, the data input buffer 6 latches data and outputs it to the data lines D0, $\overline{D0}$, D1 and $\overline{D1}$. In this case, $$(D1, D0) = (1, 1)$$
$$= (V_{CC}, V_{CC})$$

Next, at time t2, the data at the data lines D0 and $\overline{D0}$ are transmitted to the divided bit lines BL0-0 and $\overline{BL0}$-0, respectively, and the data at the data lines D1 and $\overline{D1}$ are transmitted to the divided bit lines BL0-1 and $\overline{BL0}$-1, respectively.

Figures 15A, 15B:
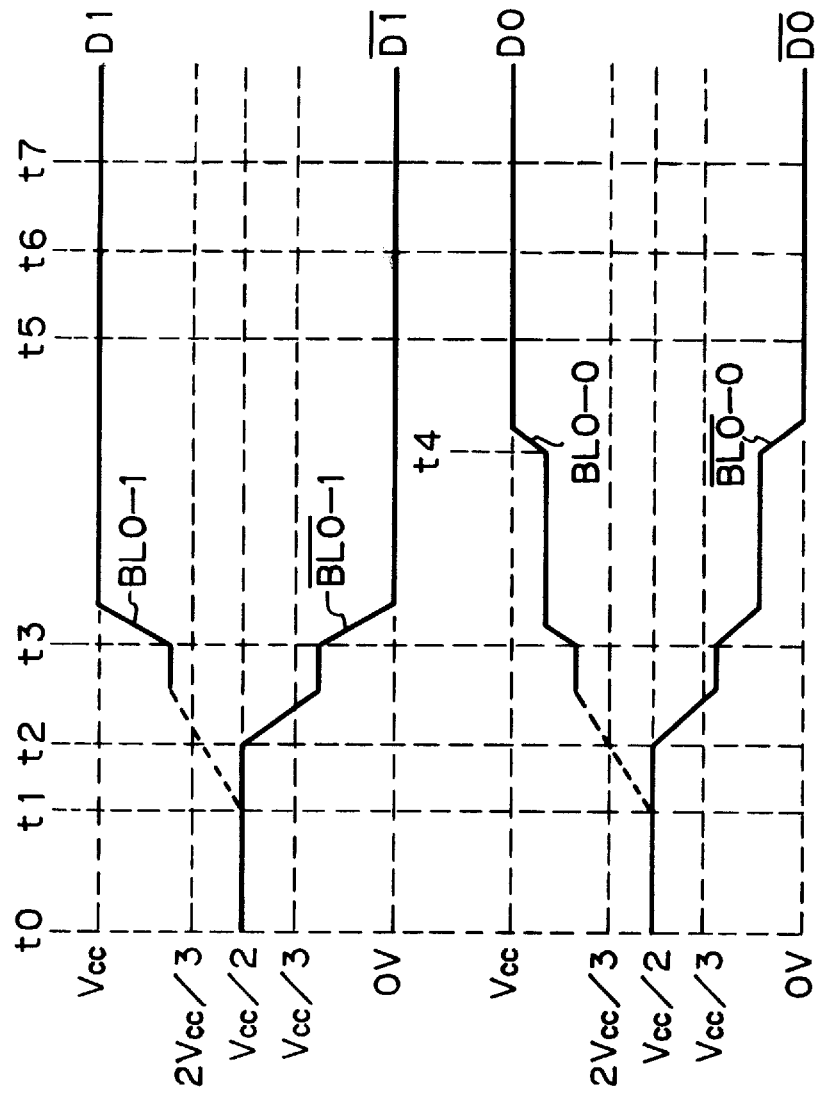

Next, at time t3, as shown in FIG. 15A, the difference in potential between the divided bit lines BL0-1 and $\overline{BL0}$-1 is increased. That is, the voltage at the divided bit line BL0-1 is increased to $V_{CC}$, and the voltage at the divided bit line $\overline{BL0}$-1 is decreased to 0 V.

When the voltages at the divided bit lines BL0-1 and $\overline{BL0}$-1 are changed, the voltages at the divided bit lines BL0-0 and $\overline{BL0}$-0 are also changed in an opposite direction thereto due to the capacitive coupling of the coupled capacitors CC1 and CC2. That is, as shown in FIGS. 15A and 15B, the voltage at the divided bit line BL0-0 is increased, and the voltage at the divided bit line $\overline{BL0}$-0 is decreased.

Next, at time t4, as shown in FIG. 14B, the difference in potential between the divided bit lines BL0-0 and $\overline{BL0}$-0 is increased. That is, the voltage at the divided bit line BL0-0 is increased to $V_{CC}$, and the voltage at the divided bit line $\overline{BL0}$-0 is decreased to 0 V.

Next, at time t6, the divided bit lines BL0-0 and $\overline{BL0}$-0 are electrically connected to the divided bit lines BL0-1 and $\overline{BL0}$-1, respectively. Therefore, charges are transferred from the divided bit lines BL0-0 and $\overline{BL0}$-0 to the divided bit lines BL0-1 and $\overline{BL0}$-1 or vice versa, and as a result, the voltages at the divided bit lines BL0-0 and $\overline{BL0}$-0 conform to the voltages at the divided bit lines and BL0-1, respectively. In this case, since CB0/CB1=1/2, the voltage V(BL0) at the divided bit line BL0-0 is $$V(BL0) = (CB1 \times V_{CC} + CB0 \times V_{CC})/(CB0 + CB1)$$
$$= V_{CC}$$

Thus, the voltage at the bit line BL0-0 connected to the memory cell $C_{0,\,0}$ is caused to be $V_{CC}$.

Finally, at time t7, a writing operation of $V_{CC}$ upon the memory cell $C_{0,\,0}$ is completed.

Thus, in FIGS. 6 and 7, two bit data (D0, D1) can be directly written without converting two-bit data into three-bit data.

The refresh operation of the device of FIGS. 6 and 7 is carried out in a similar way to the above-described read operation. For example, a refresh operation using a "CAS BEFORE RAS" method is explained below.

First, when the inverted signal of the column address strobe signal CAS is made active (low) before the inverted signal of the row address strobe signal RAS is made active (low), the control circuit 8 generates a row address RA from the refresh address counter thereof and transmits it to the row decoder 3. Simultaneously, the control circuit 8 generates a row activation signal $\phi_R$ and transmits it to the row decoder 3. Therefore the row decoder 3 selects one of the word lines which is in this case the word line WL0. As a result, the voltage at the bit line BL0, i.e., at the divided bit lines BL0-0 and BL0-1 is changed in accordance with data previously stored in the memory cell $C_{0,\,0}$. In this case, the voltage at the bit $\overline{BL0}$, i.e., at the divided bit lines $\overline{BL0}$-0 and $\overline{BL0}$-1 remains at $V_{CC}/2$. Then, the voltage of the gate selection signal TG is made low to turn OFF the transfer gates T1, so that the divided bit lines BL0-0 and $\overline{BL0}$-0 are electrically separated from the divided bit lines BL0-1 and $\overline{BL0}$-1.

Next, the control circuit 8 generates a sense activation signal $\phi_{S1}$ and transmits it to the sense amplifiers SA1 (SA01). As a result, the difference in potential between the divided bit lines BL0-1 and $\overline{BL0}$-1 is increased.

When the voltages at the divided bit lines BL0-1 and $\overline{BL0}$-1 are changed, the voltages at the divided bit lines BL0-0 and $\overline{BL0}$-0 are also changed in an opposite direction thereto due to the capacitive coupling of the coupled capacitors CC1 and CC2.

Next, the control circuit 8 generates a sense activation signal $\phi_{S0}$ and transmits it to the sense amplifiers SA0

(SA00). As a result, the difference in potential between the divided bit lines BL0-0 and $\overline{BL0}$-0 is increased.

Then, the sense activation signals $\phi_{S0}$ and $\phi_{S1}$ are made low to deactivate the sense amplifiers SA0 (SA00) and SA1 (SA10).

Next, the control circuit 8 makes the gate selection signal TG active (high), so that the divided bit lines BL0-0 and $\overline{BL0}$-0 are electrically connected to the divided bit lines BL0-1 and $\overline{BL0}$-1, respectively. Therefore, charges are transferred from the divided bit lines BL0-0 and $\overline{BL0}$-0 to the divided bit lines BL0-1 and $\overline{BL0}$-1 or vice versa, and as a result, the voltages at the divided bit lines BL0-0 and $\overline{BL0}$-0 conform to the voltages at the divided bit lines BL0-1 and $\overline{BL0}$-1, respectively. In this case, since CB0/CB1=1/2, the voltage V (BL0) at the divided bit line BL0-0 is

V(BL0)=(CB1×D1+CB0×D0)·$V_{CC}$/(CB0+CB1)

This voltage V(BL0) is the same as the voltage corresponding to the data previously stored in the memory cell $C_{0,0}$.

Thus, the voltage at the bit line BL0-0 connected to the memory cell $C_{0,0}$ is restored.

Finally, the row activation signal $\phi_R$ is made low to deactivate the row decoder 3, thus completing a restoring or refreshing operation upon the memory cell $C_{0,0}$. Then, the refresh address counter is incremented or decremented to carry out another refresh operation.

Figure 16:
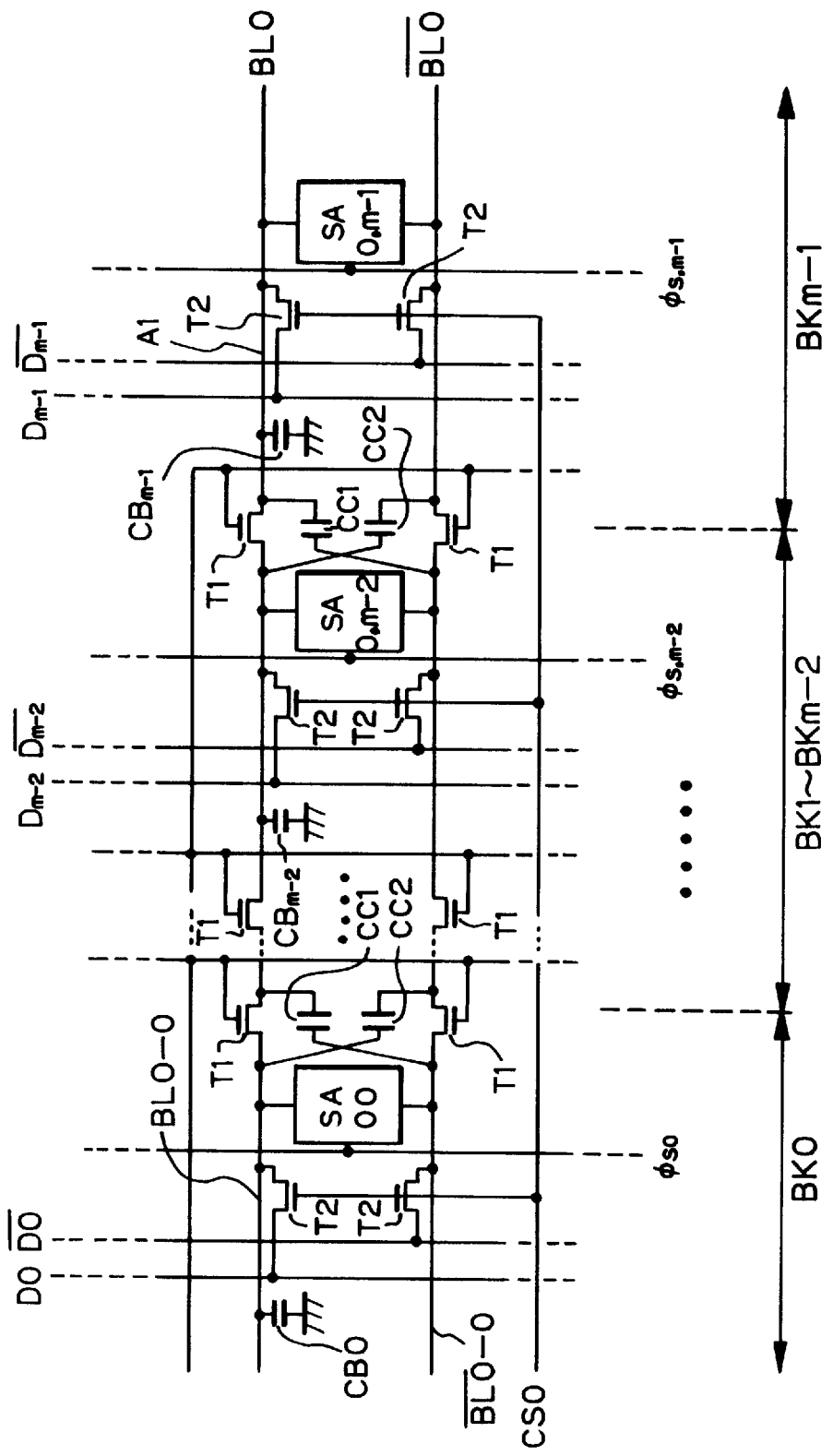
FIGS. 16 is a circuit diagram illustrating a second embodiment of the multi-valued DRAM device according to the present invention.

In FIG. 16, which illustrates a second embodiment of the present invention, the four-valued DRAM device of FIG. 6 is expanded to a $2^m$-valued DRAM device. Also, in FIG. 16, only one pair of bit lines $\overline{BL0}$ and BL0 are illustrated; the other bit lines are omitted for simplifying the description.

The bit lines BL0 and $\overline{BL0}$ are divided into m blocks BK0, BK1, . . . , BK(m−2), BK(m−1) which are electrically separated by transfer gates T1 controlled by a gate selection signal TG. Each pair of divided bit lines such as BL0-0 and $\overline{BL0}$-0 are connected to sense amplifiers SA0,0, SA0,1, . . . , SA0,m−2, SA0,m−1, respectively, which are activated by sense activation signals $\phi_{S0}$, $\phi_{S1}$, . . . $\phi_{S,m-2}$, $\phi_{S,m-1}$, respectively. In this case, the ratio of the stray capacitances CB0, CB1, CB2, . . . , CBm−2, CBm−1 of the divided bit lines in the blocks BK0, BK1, BK2, . . . , BKm−2, BKm−1 are $1:2:2^2: \ldots :2^{m-2}:2^{m-1}$ For realizing this, the ratio of the number of word lines in the blocks BK0, BK1, BK2, . . . , BKm−2, BKm−1 are $1:2:2^2: \ldots :2^{m-2}:2^{m-1}$ Also, each memory cell (not shown) stores information corresponding to one of the following voltages:

0 V $V_{CC}/2^m$ $V_{CC}/2^{m-1}$ $3V_{CC}/2^m$

.
.
.

$(2^m - 1)V_{CC}/2^m$ $V_{CC}$

Data lines D0, $\overline{D0}$, D1, $\overline{D1}$, . . . , Dm−2, $\overline{Dm-2}$, Dm−1, $\overline{Dm-1}$ are connected between each divided bit line pair in the block BK0, BK1, . . . , BKm−2, BKm−1 and the data output buffer 7 of FIG. 7.

The operation of the $2^m$-valued DRAM device of FIG. 16 is similar to that of the four-valued DRAM device of FIG. 6. That is, in FIG. 6, the sense activation signals $\phi_{S1}$ and $\phi_{S0}$ are sequentially generated, while, in FIG. 16, the sense activation signals $\phi_{S,m-1}, \phi_{S,m-2}, \ldots, \phi_{S1}, \phi_{S0}$ are sequentially generated.

In FIG. 16, m-bit data (D0, D1, . . . , Dm−2, Dm−1) can be directly read and written without converting $2^{m-1}$-bit data into m-bit data or vice versa.

Figure 17:
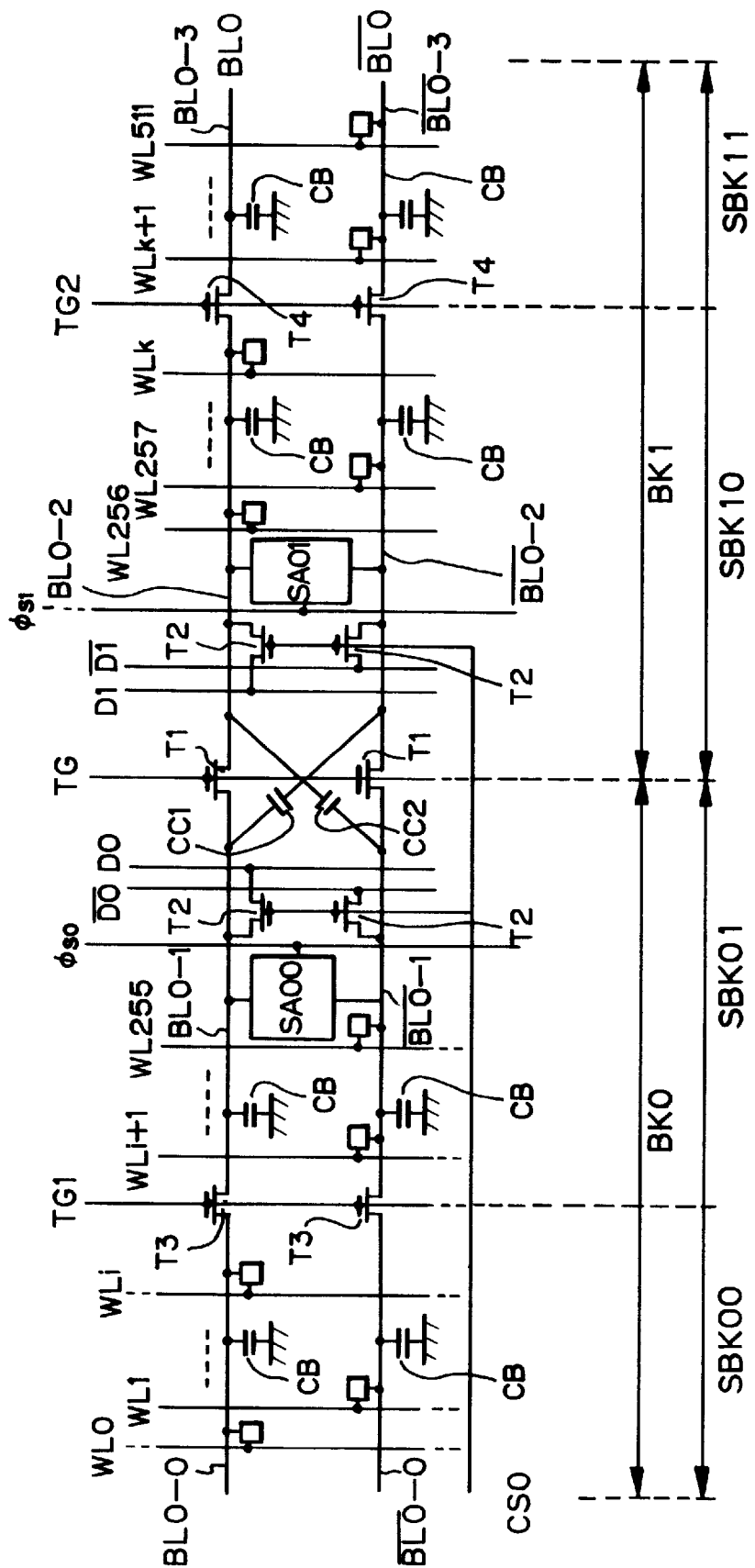
FIG. 17 is a circuit diagram illustrating a third embodiment of the multi-valued DRAM device according to the present invention.

In FIG. 17, which illustrates a third embodiment of the present invention, the block BK0 of lines BL0 and $\overline{BL0}$ of FIG. 6 is further divided into two sub blocks SBK00 and SBK01 which are electrically separated by transfer gates T3 controlled by a gate selection signal TG1. Also, the block BK1 of the bit lines BL0 and $\overline{BL0}$ of FIG. 6 is further divided into two sub blocks SBK10 and SBK11, which are electrically separated by transfer gates T4 controlled by a gate selection signal TG2. In this case, the number of word lines in the block BK0 is the same as that of word lines in the block BK1, and therefore, the numbers of word lines in the sub blocks SBK00, SBK01, SBK10 and SBK11 are the same, that is, 128. Thus, the stray capacitance CB of each of divided bit lines BL0-0, $\overline{BL0}$-0, BL0-1, $\overline{BL0}$-1, BL0-2, $\overline{BL0}$-2, BL0-3 and $\overline{BL0}$-3 is the same.

Figure 18:
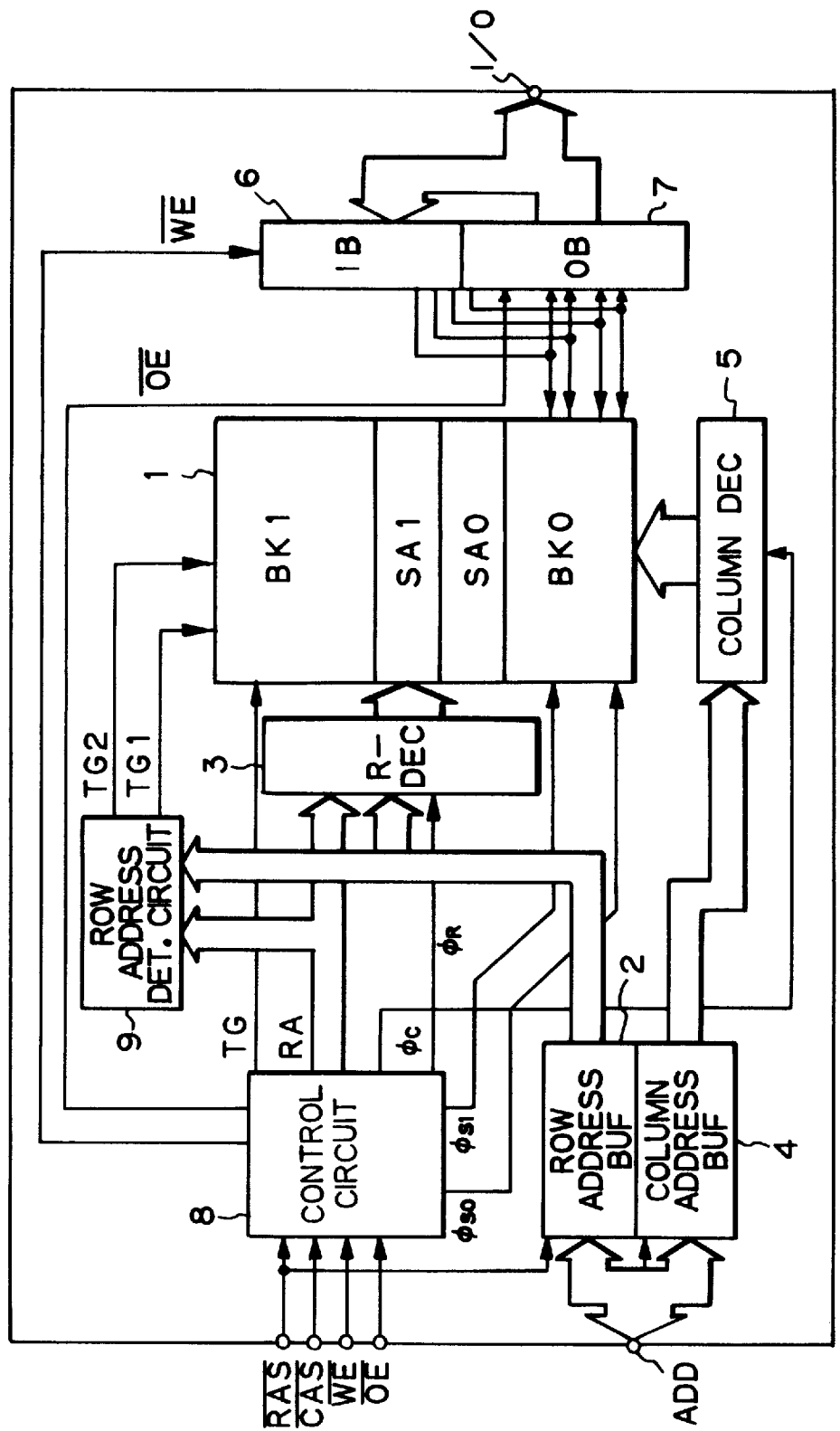
FIG. 18 is a block circuit diagram illustrating a DRAM device incorporating the circuit of FIG. 17.

The circuit of FIG. 17 is incorporated into a DRAM device as illustrated in FIG. 18. In FIG. 18, a row address determination circuit 9 is added to the elements of FIG. 7. That is, the row address determination circuit 9 receives one bit of a row address from the row address buffer 2 or the refresh counter of the control circuit 8 to determine whether an accessed row belongs to the block BK0 or BK1. If the accessed row belongs to the block BK0, the row address determination circuit 9 makes the gate selection signals TG1 and TG2 high and low, respectively. As a result, the sub block SBK00 is electrically connected to the sub block SBK01, while the sub block SBK10 is electrically separated from the sub block SBK11. In this case, the stray capacitance of the divided bit lines BL0-0 and BL0-1 (BL0-0 and BL0-1) of the block BK0 to that of the divided bit line BL0-2 (BL0-2) of the sub block SBK10 is 2:1. On the other hand, if the accessed row belongs to the block BK1, the row address determination circuit 9 makes the gate selection signals TG1 and TG2 low and high, respectively. As a result, the sub block SBK00 is electrically separated from the sub block SBK01, while the sub block SBK10 is electrically connected to the sub block SBK11. In this case, the stray capacitance of the divided bit lines BL0-1 and BL0-2 (BL0-1 and BL0-2) of the block BK1 to that of the divided bit line BI0-1 (BL0-1) of the sub block SBK01 is 2:1.

Returning to FIG. 6, if the capacitance of each memory cell is $C_S$, a capacitance C of each of the bit lines BL0 and $\overline{BL0}$ under the condition that the transfer gates T1 are turned ON is $$C = CB0 + CB1$$
$$= 3CB0$$

If a memory cell having information corresponding to $V_{CC}$ is connected to one of the bit lines BL0 and $\overline{BL0}$ and a memory cell having information corresponding to 0 V is connected to the other, a maximum difference $V_r$ in potential between the bit lines BL0 and BL0 is represented by $V_r = V_{CC}/(1+3 \cdot CB0/C_S)$ Therefore, the difference 2 ΔV in potential between the levels is $$2\Delta V = V_r/$$
$$= V_{CC}/(3(1+3 \cdot CB0/C_S))$$

On the other hand, when the voltages at the divided bit lines BL0-1 and $\overline{BL0}$-1 are swung by an amplitude of $V_{CC}/2$, a difference xV in potential created in the divided bit lines BL0-0 and $\overline{BL0}$-0 due to the capacitive coupling of the coupled capacitors CC1 and CC2 whose capacitance is CC can be represented by $xV=V_{CC}/(2(1+CB0/CC))$ Therefore, if $\Delta V=xV$ then $1+(CB0/CC=3\cdot(1+3\cdot CB0/C_S)$ Here, if CB0 >> CC and CB0 >> $C_S$, then $CB0/CC=9\cdot CB0/C_S$ Therefore, $$CC=C_S/9 \qquad (1)$$

Note that, if CB0 >> $C_S$ is not satisfied, the equation (1) can be replaced by $$CC=aC_S+b \qquad (2)$$

where 0<a<1 and b>0.

When manufacturing the coupled capacitors CC1 and CC2, the following conditions are required.

The ratio of the capacitances of the coupled capacitors CC1 and CC2 to those of the memory cells is definite regardless of the fluctuation of the manufacturing process.

The coupled capacitors can be manufactured without additional manufacturing processes.

A leakage current flowing through the coupled capacitors can be reduced.

The capacitances of the coupled capacitors are stable.

The structure of one of the coupled capacitors CC1 and CC2 of FIG. 6 as well as those of FIGS. 16 and 17 is explained next with reference to FIGS. 19, In FIG. 19, which illustrates a first example of the coupled capacitor, A1 designates a coupled capacitor forming area, and A2 designates a memory cell array area in which stacked capacitor type memory cells are formed.

In FIG. 19, reference numeral 101 designates a P--type monocrystalline silicon substrate. The silicon substrate 101 is thermally oxidized to grow a field silicon oxide layer 102 by using a local oxidation of silicon (LOCOS) process. Also, a gate silicon oxide layer 103 and a gate electrode (word line) layer 104a are formed on active areas of the silicon substrate 101.

Also, N+-type impurity diffusion regions 105b and 105a are formed within the silicon substrate 101 in self-alignment with the field silicon oxide layer 102 and the gate silicon oxide layer 103, respectively.

In addition, an insulating layer 106 made of silicon oxide is deposited on the entire surface. Contact holes are perforated in the insulating layer 106, and contact plugs 107a and 107b are buried in the contact holes.

Further, a capacitor lower electrode layer 108 is formed on the contact plugs 107a and 107b. A capacitor insulating layer 109 is formed on the capacitor lower electrode layer 107. A capacitor upper electrode layer 110 is formed on the capacitor insulating layer 109.

Further, an insulating layer 111 made of phospho-silicated glass (PSG) is deposited on the entire surface. Contact holes are perforated in the insulating layer 111, and contact plugs 112a, 112b and 112c are buried in the contact holes. Formed on the contact plugs 112a, 112b and 112c are bit line layers 113a and 113b. In this case, the contact plug 112a connects the bit line layer 113a such as the divided bit line BL0-0 to the N+-type impurity regions 105a in the memory cell array area A2. The contact plug 112c connects the bit line layer 113a such as BL0-1 to the contact plug 112b in the coupled capacitor forming area A1. The contact plug 112c connects the bit line layer 113b such as BL0-1 to the contact plug 112c in the coupled capacitor forming area A1.

In FIG. 19, nine capacitor units each comprised of the capacitor lower electrode layer 108, the capacitor insulating layer 109 and the capacitor upper electrode layer 110 are connected in series by the contact plugs 107b via the N+-type impurity diffusion regions 105b. The nine capacitor units are also connected by the contact plugs 112b and 112c between the bit line layers 113a and 113b. In this case, each of the capacitor units in the coupled capacitor forming area A1 has the same configuration as the capacitors in the memory cell array A2. Therefore, the capacitance CC of the nine capacitor unit is represented by $$1/CC = (1/C_S + 1/C_S + \ldots + 1/C_S)$$
$$= 9/C_S$$

Therefore, the equation (1) can be satisfied.

In FIG. 19, since the nine capacitor units are manufactured simultaneously with the capacitors of the memory cells, the ratio of $CC/C_S$ can be definite regardless of the manufacturing process, which increases the operating margin. Also, additional manufacturing processes for the nine capacitor units are unnecessary, which reduces the manufacturing cost. Since a difference in potential between the bit line layers 113a and 113b is divided into small voltages each applied to one of the capacitor units, a leakage current flowing through each of the capacitor units can be reduced, and the destruction of the capacitor insulating layer 109 can be avoided, which can ensure a stable operation.

In FIG. 20, which illustrates a second example of the coupled capacitor, a gate electrode layer 104b is provided instead of the N+-type impurity diffusion regions 105b of FIG. 19 in the coupled capacitor forming region A1. That is, the gate electrode layer 104b is formed simultaneously with the gate electrode layer 104a in the memory cell array area A2. Therefore, the contact plugs 107b are connected to the gate electrode layer 104b.

In FIG. 20, nine capacitor units each comprised of the capacitor lower electrode layer 108, the capacitor insulating layer 109 and the capacitor upper electrode layer 110 are connected in series by the contact plugs 107b via the gate electrode layer 104b. The nine capacitor units are also connected by the contact plugs 112b and 112c between the bit line layers 113a and 113b. The nine capacitor units of FIG. 20 have a similar effect to those of the nine capacitor units of FIG. 19.

In FIG. 21, which illustrates a third example of the coupled capacitor, an N+-type impurity diffusion region 105c and a gate electrode layer 104c having the gate silicon oxide layer 103 therebetween are added to the elements of FIG. 19. The N+-type impurity diffusion region 105c is connected via a contact plug 112d to the bit line layer 113a, and the gate electrode layer 104c is connected via a contact plug 112c to the bit line layer 113b. Therefore, the N+-type impurity diffusion region 105c, the gate insulating layer 103 and the gate electrode layer 104c form a MOS capacitor in parallel with a stacked capacitor having a capacitance of $C_S/9$. In this case, the capacitance $C_0$ of the MOS capacitor is not dependent upon the stacked capacitors in the memory cell array area A2. Thus, the equation (2) can be satisfied.

In FIG. 21, since the MOS capacitor for the coupled capacitor is manufactured simultaneously with the MOS transistors additional manufacturing processes for the MOS capacitor are unnecessary, which reduces the manufacturing cost.

Note that the MOS capacitor of FIG. 21 can be formed in the structure of FIG. 20.

Figure 22:
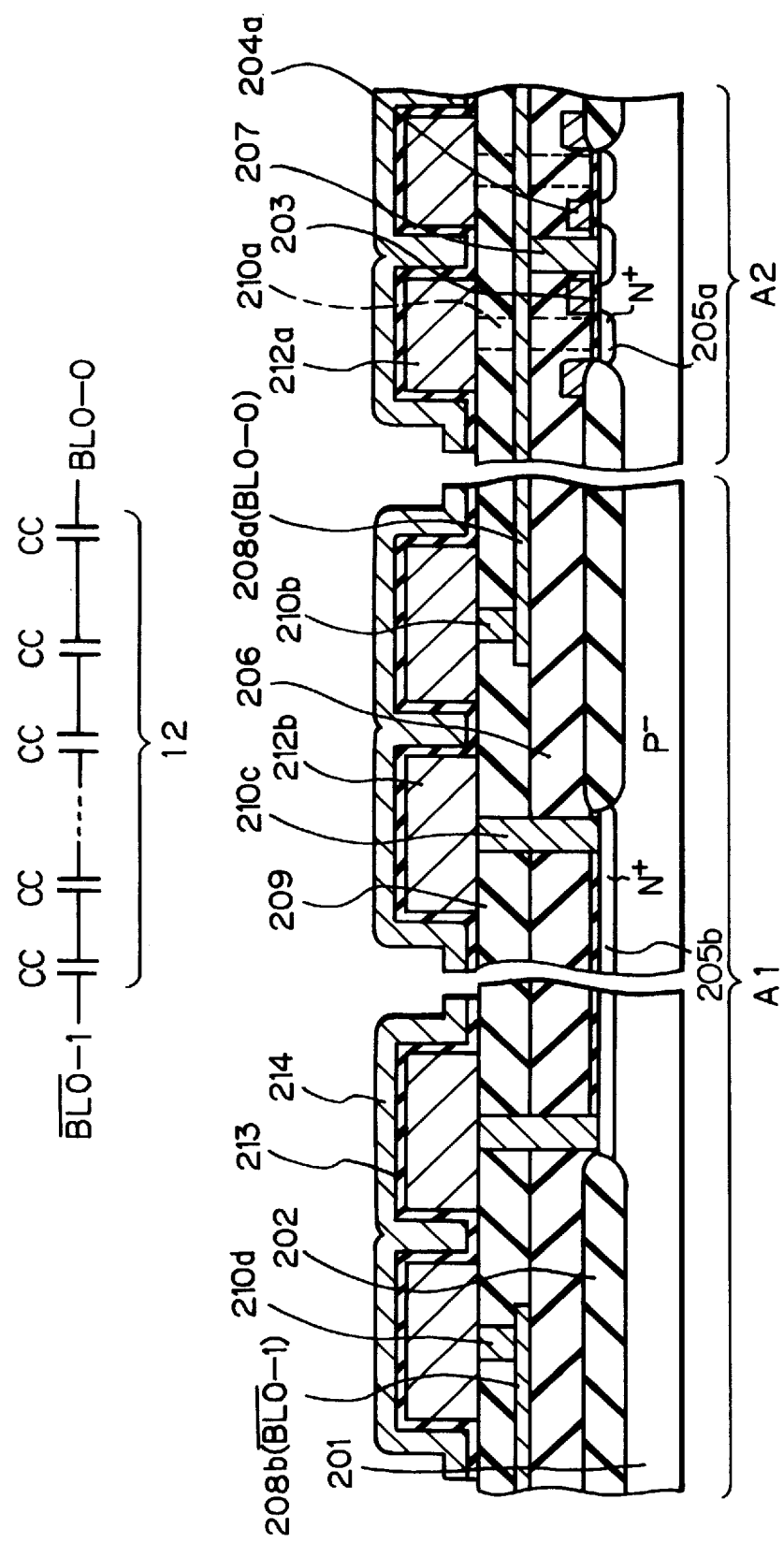

In FIG. 22, which illustrates a fourth example of the coupled capacitor, stacked capacitor type memory cells having capacitors over bit lines (COB) are formed.

In FIG. 22, reference numeral 201 designates a P⁻-type monocrystalline silicon substrate. The silicon substrate 201 is thermally oxidized to grow a field silicon oxide layer 202 by using a LOCOS process. Also, a gate silicon oxide layer 203 and a gate electrode (word line) layer 204a are formed on active areas of the silicon substrate 201.

Also, N⁺-type impurity diffusion regions 205a and 205b are formed within the silicon substrate 201 in self-alignment with the field silicon oxide layer 203 and the gate silicon oxide layer 202, respectively.

In addition, an insulating layer 206 made of silicon oxide is deposited on the entire surface. Contact holes are perforated in the insulating layer 206, and contact plugs 207 are buried in the contact holes. Also, formed on the insulating layer 206 are bit line layers 208a and 208b. In this case, the bit line layer 208a is connected via the contact plugs 207 to the N⁺-type impurity regions 205a.

Further, an insulating layer 209 made of PSG is deposited on the entire surface. Contact holes are perforated in the insulating layers 209 and 206, and contact plugs 210a, 210b, 210c and 210d are buried in the contact holes. Formed on the contact plugs 210a, 210b, 210c and 210d are capacitor lower electrode layers 212a and 212b. In this case, the contact plug 210a connects the capacitor lower electrode layer 212a to the N⁺-type impurity diffusion region 205a, the contact plug 210b connects the bit line layer 208a to the capacitor lower electrode layer 212b, the contact plug 210c connects the capacitor lower electrode layer 212b to the N⁺-type impurity diffusion region 205b, and the contact plug 210d connects the bit line layer 208b to the capacitor lower electrode layer 212b.

Further, a capacitor insulating layer 213 is formed on the capacitor lower electrode layers 212a and 212b. A capacitor upper electrode layer 214 is formed on the capacitor insulating layer 213.

In FIG. 22, twelve capacitor units each comprised of the capacitor lower electrode layer 212b, the capacitor insulating layer 213 and the capacitor upper electrode layer 214 are connected in series by the contact plugs 210c via the N⁺-type impurity diffusion regions 205b. The twelve capacitor units are also connected by the contact plugs 210b and 210d between the bit line layers 208a and 208b. In this case, each of the capacitor units in the coupled capacitor forming area A1 has a similar configuration to the capacitors in the memory cell array A2, and has a capacitance of $4C_S/3$. Therefore, the capacitance CC of the twelve capacitor unit is represented by $$1/CC = (3/(4C_S) + 3/(4C_S) + \ldots + 3/(4C_S)$$
$$= 12 \cdot 3/(4C_S)$$
$$= 9/C_S$$

Therefore, the equation (1) can be satisfied.

Even in FIG. 22, since the twelve capacitor units are manufactured simultaneously with the capacitors of the memory cells, the ratio of $CC/C_S$ can be definite regardless of the manufacturing process, which increases the operating margin. Also, additional manufacturing processes for the twelve capacitor units are unnecessary, which reduces the manufacturing cost. Since a difference in potential between the bit line layers 208a and 208b is divided into small voltages each applied to one of the capacitor units, a leakage current flowing through each of the capacitor units can be reduced, and the destruction of the capacitor insulating layer 213 can be avoided, which can ensure a stable operation.

Figure 23:
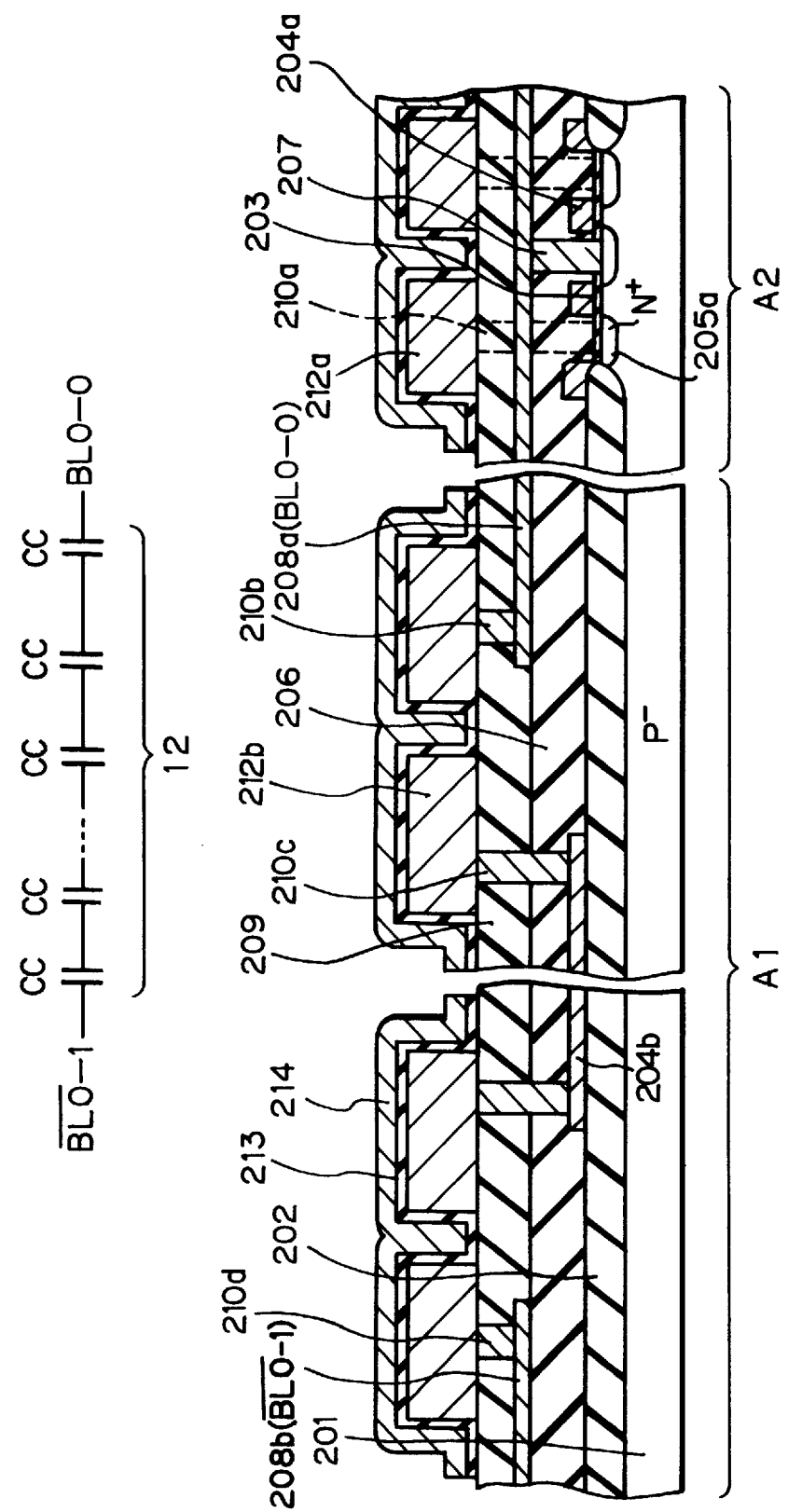

In FIG. 23, which illustrates a fifth example of the coupled capacitor, a gate electrode layer 204b is provided instead of the N⁺-type impurity diffusion regions 205b of FIG. 22 in the coupled capacitor forming region A1. That is, the gate electrode layer 204b is formed simultaneously with the gate electrode layer 204a in the memory cell array area A2. Therefore, the contact plugs 210c are connected to the gate electrode layer 204b.

In FIG. 23, twelve capacitor units each comprised of the capacitor lower electrode layer 212b, the capacitor insulating layer 213 and the capacitor upper electrode layer 214 are connected in series by the contact plugs 210c via the gate electrode layer 204b. The twelve capacitor units are also connected by the contact plugs 210b and 210d between the bit line layers 208a and 208b. The twelve capacitor units of FIG. 23 have a similar effect to those of the nine capacitor units of FIG. 22.

Figure 24:
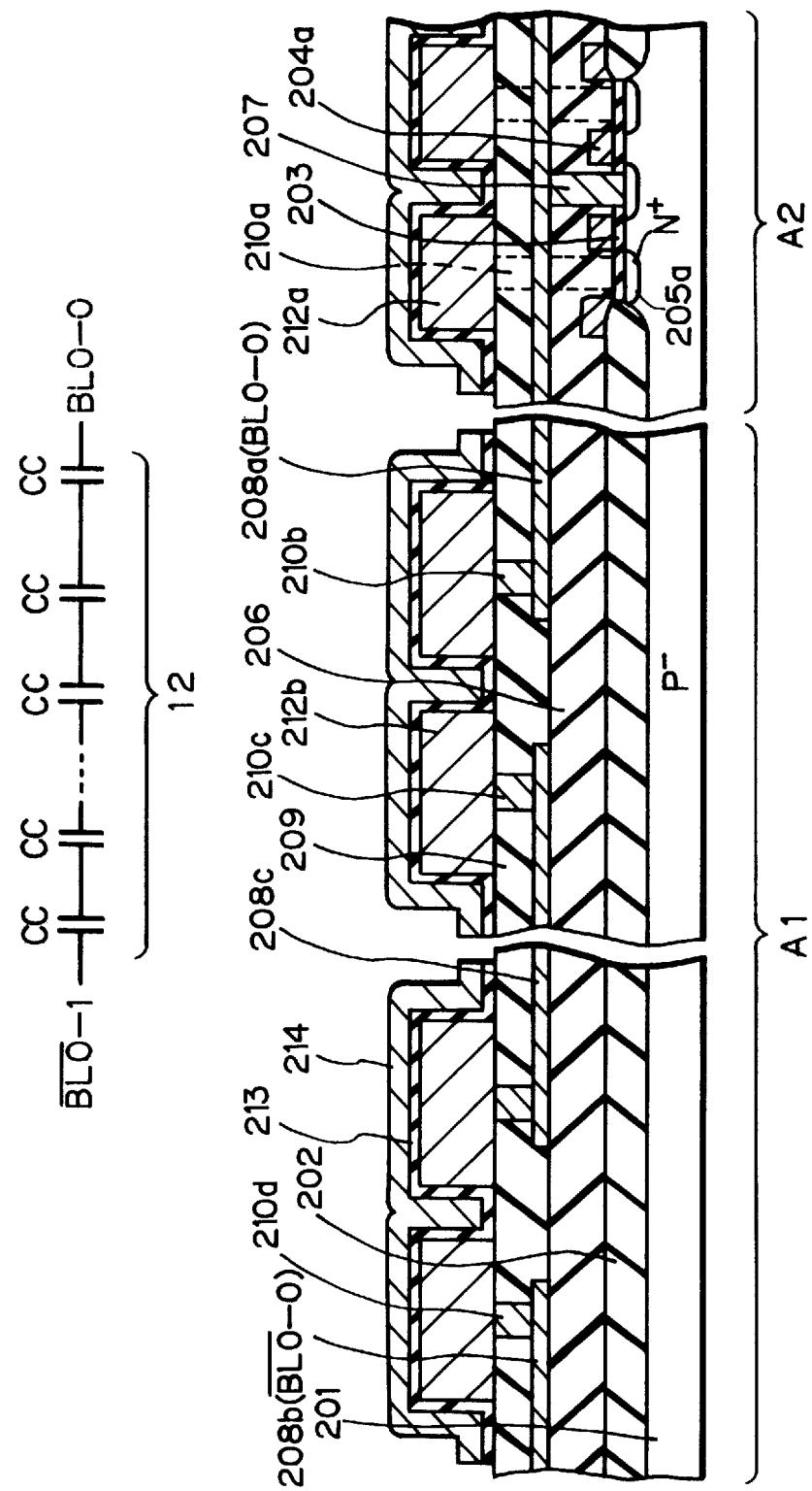

In FIG. 24, which illustrates a sixth example of the coupled capacitor, a bit line layer 208c is provided instead of the N⁺-type impurity diffusion regions 205b of FIG. 22 in the coupled capacitor forming region A1. That is, the bit line layer 208c is formed simultaneously with the bit line layers 208a and 208b in the memory cell array area A2. Therefore, the contact plugs 210c are connected to the bit line layer 208c.

In FIG. 24, twelve capacitor units each comprised of the capacitor lower electrode layer 212b, the capacitor insulating layer 213 and the capacitor upper electrode layer 214 are connected in series by the contact plugs 210c via the bit line layer 208c. The twelve capacitor units are also connected by the contact plugs 210b and 210d between the bit line layers 208a and 208b. The twelve capacitor units of FIG. 24 have a similar effect to that of the nine capacitor units of FIG. 22.

Figure 25:
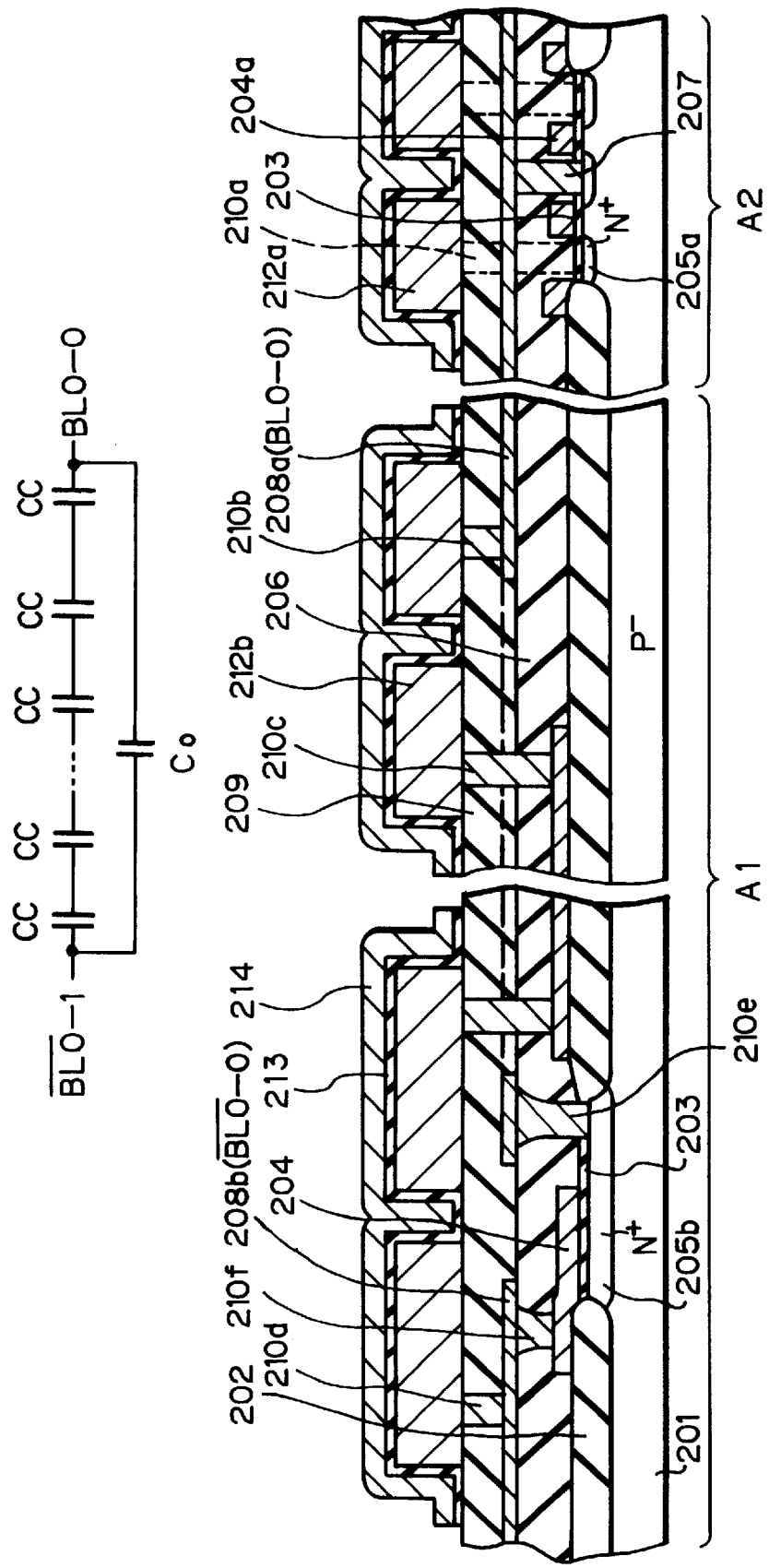

In FIG. 25, which illustrates a seventh example of the coupled capacitor, an N⁺-type impurity diffusion regions 205b and a gate electrode layer 204 having the gate silicon oxide layer 203 therebetween are added to the elements of FIG. 23. The N⁺-type impurity diffusion regions 205b is connected via a contact plug 210e to the bit line layer 208a, and the gate electrode layer 204c is connected via a contact plug 210f to the bit line layer 208b. Therefore, the N⁺-type impurity diffusion regions 205b, the gate insulating layer 203 and the gate electrode layer 204c form a MOS capacitor in parallel with a stacked capacitor having a capacitance of $C_S/9$. In this case, the capacitance $C_0$ of the MOS capacitor is not dependent upon the stacked capacitors in the memory cell array area A2. Thus, the equation (2) can be satisfied.

In FIG. 25, since the MOS capacitor for the coupled capacitor is manufactured simultaneously with the MOS transistors additional manufacturing processes for the MOS capacitor are unnecessary, which reduces the manufacturing cost.

Note that the MOS capacitor of FIG. 25 can be formed in the structure of FIGS. 22 and 24.

Figure 26:
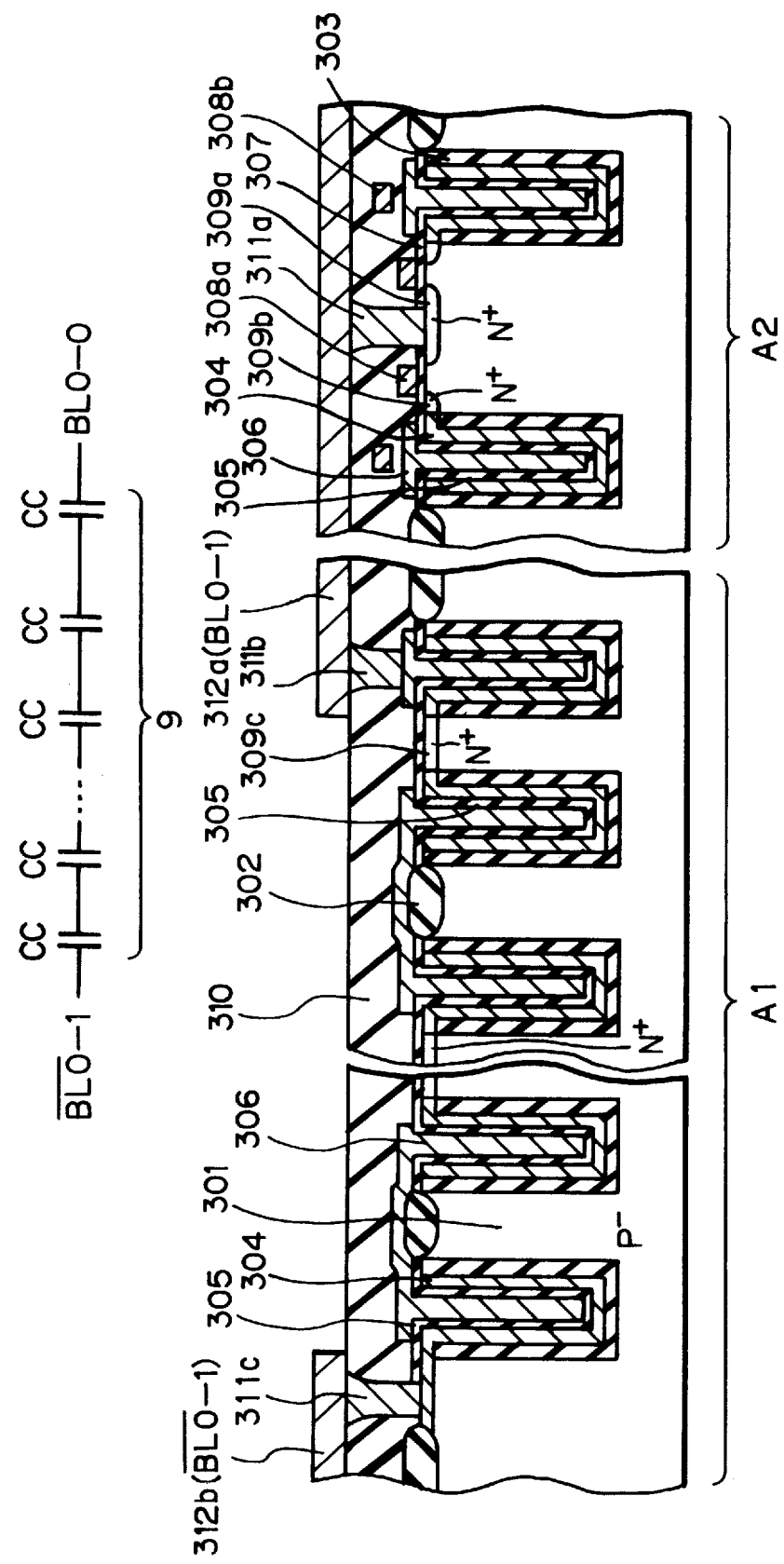

In FIG. 26, which illustrates an eighth example of the coupled capacitor, A1 designates a coupled capacitor forming area, and A2 designates a memory cell array area in which stacked capacitors in trench type memory cells are formed.

In FIG. 26, reference numeral 301 designates a P⁻-type monocrystalline silicon substrate. The silicon substrate 301 is thermally oxidized to grow a field silicon oxide layer 302 by using a TOCOS process.

Grooves are formed in the silicon substrate 301, and a trench silicon oxide layer 303 is formed within the grooves.

A capacitor lower electrode layer 304 is formed on the trench silicon oxide layer 303. Also, a capacitor insulating layer 305 made of silicon oxide is formed on the capacitor lower electrode layer 305. Further, a capacitor upper electrode layer 306 is formed on the capacitor insulating layer 305. Thus, stacked capacitors are formed within the grooves.

Also, a gate silicon oxide layer 307 and gate electrode (word line) layers 308a and 308b are formed on active areas of the silicon substrate 301.

Also, N$^+$-type impurity diffusion regions 309a 309b and 309c are formed within the silicon substrate 101 in self-alignment with the field silicon oxide layer 302, the gate silicon oxide layer 307, and the capacitor upper electrode layer 306. In this case, the N$^+$-type impurity diffusion regions 309a and 309b are source/drain regions of the transistors in the memory cell array area A2, while the N$^+$-type impurity diffusion region 309c connects capacitor units to each other in the coupled capacitor forming area A1.

In addition, an insulating layer 310 made of silicon oxide is deposited on the entire surface. Contact holes are perforated in the insulating layer 310, and contact plugs 311a, 311b and 311c are buried in the contact holes. Formed on the contact plugs 311a, 311b and 311c are bit line layers 312a and 312b. In this case, the contact plug 311a connects the bit line layer 113a such as the divided bit line BL0-0 to the N$^+$-type impurity regions 309a in the memory cell array area A2. The contact plug 311b connects the bit line layer 113a such as BL0-0 to an end of the capacitor units in the coupled capacitor forming area A1. The contact plug 311c connects the bit line layer 113b such as BL0-1 to the other end of the capacitor units in the coupled capacitor forming area A1.

In FIG. 26, nine capacitor units each comprised of the capacitor lower electrode layer 304, the capacitor insulating layer 305 and the capacitor upper electrode layer 306 are connected in series by the N$^+$-type impurity diffusion regions 309c. The nine capacitor units are also connected by the contact plugs 311b and 311c between the bit line layers 113a and 113b. In this case, each of the capacitor units in the coupled capacitor forming area A1 has the same configuration as the capacitors in the memory cell array A2. Therefore, the capacitance CC of the nine capacitor units is represented by $$1/CC = (1/C_S + 1/C_S + \ldots + 1/C_S)$$
$$= 9/C_S$$

Therefore, the equation (1) can be satisfied.

In FIG. 26, since the nine capacitor units are also manufactured simultaneously with the capacitors of the memory cells, the ratio of $CC/C_S$ can be definite regardless of the manufacturing process, which increases the operating margin. Also, additional manufacturing processes for the nine capacitor units are unnecessary, which reduces the manufacturing cost. Since a difference in potential between the bit line layers 312a and 312b is divided into small voltages each applied to one of the capacitor units, a leakage current flowing through each of the capacitor units can be reduced, and the destruction of the capacitor insulating layer 305 can be avoided, which can ensure a stable operation.

In FIG. 26, it is possible to form an additional capacitor as illustrated in FIG. 21 or 25 in the coupled capacitor forming area A1.

In the above-mentioned embodiments, the ratio of the capacitances between the divided bit lines is determined by the substantial length thereof, i.e., the number of word lines connected thereto, however, it is possible to adjust the ratio of the capacitances between the divided bit lines by connecting additional capacitors to the divided bit lines.

As explained hereinabove, according to the present invention, since the number of sense amplifiers in a semiconductor device can be reduced, the chip area can be reduced, which can enhance the manufacturing yield.

We claim:

1. A $2^m$(m=1, 2, . . . )-valued semiconductor memory device, comprising:

a plurality of word lines;

a plurality of bit line pairs each divided into m divided bit line pairs, a ratio of capacitances of said m divided bit line pairs being 1:2: . . . :$2^{m-1}$;

a plurality of memory cells each connected to one of said word lines and one bit line of said bit line pairs;

a plurality of sense amplifiers each connected to one of said bit line pairs; and a plurality of coupled capacitor pairs each cross-coupled between two adjacent divided bit line pairs of said divided bit line pairs.

2. The device as set forth in claim 1, wherein a ratio of numbers of said word lines connected to said m divided bit lines is 1:2: . . . :$2^{m-1}$.

3. A $2^m$(m=1, 2, . . . )-valued semiconductor memory device, comprising:

a plurality of word lines;

a plurality of bit line pairs each divided into m divided bit line pairs, a ratio of capacitances of said m divided bit line pairs being 1:2: . . . :$2^{m-1}$;

a plurality of memory cells each connected to one of said word lines and one bit line of said bit line pairs;

a plurality of sense amplifiers each connected to one of said bit line pairs; and a plurality of coupled capacitor pairs each cross-coupled between two adjacent divided bit line pairs of said divided bit line pairs, wherein each of said coupled capacitors comprises a series of capacitor units each having the same configuration as capacitors of said memory cells.

4. The device as set forth in claim 3, wherein a capacitance of each of said capacitor units is not smaller than a capacitance of each of said memory cells.

5. The device as set forth in claim 3, wherein each of said coupled capacitors further comprises an additional capacitor connected in parallel with said series of capacitor units, said additional capacitor being independent of said capacitors of said memory cells.

6. The device as set forth in claim 3, wherein said capacitor units comprise:

lower electrode layers;

insulating layers formed on said lower electrode layers; and upper electrode layers formed on said insulating layers, one of said capacitor units being formed by one of said lower electrode layers, one of said insulating layers and one of said upper electrode layers, two of said lower electrode layers being connected by contact plugs to an inpurity region within a semiconductor substrate, two of said first upper electrode layers being made of a common layer.

7. The device as set forth in claim 3, wherein said capacitor units comprise:

lower electrode layers;

insulating layers formed on said lower electrode layers; and upper electrode layers formed on said insulating layers, one of said capacitor units being formed by one of said lower electrode layers, one of said insulating layers and one of said upper electrode layers, two of said lower electrode layers being connected by contact plugs to a layer formed simultaneously with said word lines, two of said upper electrode layers being made of a common layer.

8. The device as set forth in claim 3, wherein said capacitor units comprise:

lower electrode layers;

insulating layers formed on said lower electrode layers; and upper electrode layers formed on said insulating layers, one of said capacitor units being formed by one of said lower electrode layers, one of said insulating layers and one of said upper electrode layers, two of said lower electrode layers being connected by contact plugs to a layer formed simultaneously with said bit line pairs, two of said upper electrode layers being made of a common layer.

9. The device as set forth in claim 3, wherein said capacitor units comprise:

lower electrode layers formed within grooves of a semiconductor substrate;

insulating layers formed on said lower electrode layers; and upper electrode layers formed on said insulating layers, one of said capacitor units being formed by one of said lower electrode layers, one of said insulating layers and one of said upper electrode layers, two of said lower electrode layers being connected to an impurity region within said semiconductor substrate, two of said first upper electrode layers being made of a common layer.

10. The device as set forth in claim 5, wherein said additional capacitor comprises:

an impurity region formed in a semiconductor substrate;

an insulating layer formed on said impurity region; and an electrode layer formed on said insulating layer.

11. The device as set forth in claim 10, wherein said impurity region is formed simultaneously with source/drain regions of said memory cells, said insulating layer being formed simultaneously with gate insulating layers of said memory cells, said electrode layer being formed simultaneously with said word lines.

12. The device as set forth in claim 1, further comprising a read control unit for electrically connecting said divided bit line pairs to each other for each of said bit line pairs, selecting one of said word lines, electrically separating said divided bit line pairs, from each other, sequentially operating said sense amplifiers, and selecting and connecting a column of said sense amplifiers to data lines.

13. The device as set forth in claim 12, wherein said reading control unit further electrically connects said divided bit line pairs to each other for each of said bit line pairs after operating said sense amplifiers.

14. The device as set forth in claim 1, further comprising a write control unit for electrically separating said divided bit line pairs from each other, setting voltages in said divided bit line pairs, electrically connecting said divided bit line pairs to each other for each of said bit line pairs, sequentially operating said sense amplifiers, electrically connecting said divided bit line pairs to each other for each of said bit line pairs, and selecting one of said lines.

15. The device as set forth in claim 1, further comprising a refresh control unit for electrically connecting said divided bit line pairs to each other for each of said bit line pairs, selecting one of said word line, electrically separating said divided bit line pairs, from each other, sequentially operating said sense amplifiers, and electrically connecting said divided bit line pairs to each other for each of said bit line pairs.

16. A four-valued semiconductor memory device, comprising:

a plurality of word lines a plurality of bit line pairs each divided into first and second divided bit line pairs, each of said first and second divided bit line pairs being further divided into two sub-divided bit line pairs, capacitances of said sub-divided bit line pairs being substantially equal to each other;

a plurality of memory cells each connected to one of said word lines and one bit line of said bit line pairs;

a plurality of sense amplifiers each connected to one of said sub-divided bit line pairs of said first and second bit line pairs on a center side of said device; and a plurality of coupled capacitor pairs each cross-coupled between said first and second divided bit line pairs, said sub-divided bit line pairs of said first divided bit line pair being electrically separated to each other when a memory cell of said memory cells connected to said second divided bit line pair is accessed, said sub-divided bit line pairs of said second divided bit line pair being electrically separated from each other when a memory cell of said memory cells connected to said first divided bit line pair is accessed.

17. A four-valued semiconductor memory device, comprising:

a plurality of word lines a plurality of bit line pairs each divided into first and second divided bit line pairs, each of said first and second divided bit line pairs being further divided into two sub-divided bit line pairs, capacitances of said sub-divided bit line pairs, being substantially equal to each other;

a plurality of memory cells each connected to one of said word lines and one bit line of said bit line pairs;

a plurality of sense amplifiers each connected to one of said sub-divided bit line pairs of said first and second bit line Pairs on a center side of said device; and a plurality of coupled capacitor pairs each cross-coupled between said first and second divided bit line pairs, said sub-divided bit line pairs of said first divided bit line pair being electrically separated to each other when a memory cell of said memory cells connected to said second divided bit line pair is accessed, said sub-divided bit line pairs of said second divided bit line pair being electrically separated from each other when a memory cell of said memory cells connected to said first divided bit line pair is accessed;

wherein each of said coupled capacitors comprises a series of capacitor units each having the same configuration as capacitors of said memory cells.

18. The device as set forth in claim 17, wherein a capacitance of each of said capacitor units is not smaller than a capacitance of each of said memory cells.

19. The device as set forth in claim 17, wherein each of said coupled capacitors further comprises an additional capacitor connected in parallel with said series of capacitor units, said additional capacitor being independent of said capacitors of said memory cells.

20. The device as set forth in claim 17, wherein said capacitor units comprise:
   lower electrode layers;
   insulating layers formed on said lower electrode layers; and
   upper electrode layers formed on said insulating layers,
   one of said capacitor units being formed by one of said lower electrode layers, one of said insulating layers and one of said upper electrode layers,
   two of said lower electrode layers being connected by contact plugs to an impurity region within a semiconductor substrate,
   two of said first upper electrode layers being made of a common layer.

21. The device as set forth in claim 17, wherein said capacitor units comprise:
   lower electrode layers;
   insulating layers formed on said lower electrode layers; and
   upper electrode layers formed on said insulating layers,
   one of said capacitor units being formed by one of said lower electrode layers, one of said insulating layers and one of said upper electrode layers,
   two of said lower electrode layers being connected by contact plugs to a layer formed simultaneously with said word lines,
   two of said upper electrode layers being made of a common layer.

22. The device as set forth in claim 17, wherein said capacitor units comprise:
   lower electrode layers;
   insulating layers formed on said lower electrode layers; and
   upper electrode layers formed on said insulating layers,
   one of said capacitor units being formed by one of said lower electrode layers, one of said insulating layers and one of said upper electrode layers,
   two of said lower electrode layers being connected by contact plugs to a layer formed simultaneously with said bit line pairs,
   two of said upper electrode layers being made of a common layer.

23. The device as set forth in claim 17, wherein said capacitor units comprise:
   lower electrode layers formed within grooves of a semiconductor substrate;
   insulating layers formed on said lower electrode layers; and
   upper electrode layers formed on said insulating layers,
   one of said capacitor units being formed by one of said lower electrode layers, one of said insulating layers and one of said upper electrode layers,
   two of said lower electrode layers being connected to an impurity region within said semiconductor substrate,
   two of said first upper electrode layers being made of a common layer.

24. The device as set forth in claim 19, wherein said additional capacitor comprises:
   an impurity region formed in a semiconductor substrate;
   an insulating layer formed on said impurity region; and
   an electrode layer formed on said insulating layer.

25. The device as set forth in claim 24, wherein said impurity region is formed simultaneously with source/drain regions of said memory cells,
   said insulating layer being formed simultaneously with gate insulating layers of said memory cells,
   said electrode layer being formed simultaneously with said word lines.

26. The device as set forth in claim 16, further comprising a read control unit for determining whether a word line of said word lines to be selected is connected to said first bit line pair or said second bit line pair, electrically separating said sub-divided bit line pairs of said first bit line pair when the word line to be selected is connected to said second bit line pair, electrically separating said sub-divided bit line pairs of said second bit line pair when the word line to be selected is connected to said first bit line pair, electrically connecting said divided bit line pairs to each other for each of said bit line pairs, selecting said word lines to be selected, electrically separating said divided bit line pairs from each other, sequentially operating said sense amplifiers, and selecting and connecting a column of said sense amplifiers to data lines.

27. The device as set forth in claim 26, wherein said reading control unit further electrically connects said divided bit line pairs to each other for each of said bit line pairs after operating said sense amplifiers.

28. The device as set forth in claim 16, further comprising a write control unit for determining whether a word line of said word lines to be selected is connected to said first bit line pair or said second bit line pair, electrically separating said sub-divided bit line pairs of said first bit line pair when the word line to be selected is connected to said second bit line pair, electrically separating said sub-divided bit line pairs of said second bit line pair when the word line to be selected is connected to said first bit line pair, electrically separating said divided bit line pairs from each other, setting voltages in said divided bit line pairs, electrically connecting said divided bit line pairs to each other for each of said bit line pairs, sequentially operating said sense amplifiers, electrically connecting said divided bit line pairs to each other for each of said bit line pairs, and selecting one of said lines.

29. The device as set forth in claim 16, further comprising a refresh control unit for determining whether a word line of said word lines to be selected is connected to said first bit line pair or said second bit line pair, electrically separating said sub-divided bit line pairs of said first bit line pair when the word line to be selected is connected to said second bit line pair, electrically separating said sub-divided bit line pairs of said second bit line pair when the word line to be selected is connected to said first bit line pair, electrically connecting said divided bit line pairs to each other for each of said bit line pairs, selecting one of said word lines, electrically separating said divided bit line pairs from each other, sequentially operating said sense amplifiers, and electrically connecting said divided bit line pairs to each other for each of said bit line pairs.

30. A semiconductor device comprising:
   first, second, third and fourth connection lines;
   a first switching element connected between said first and second connection lines and controlled by a first control signal;

a second switching element connected between said third and fourth connection lines and controlled by said first control signal;

a first capacitor connected between said first and fourth connection lines;

a second capacitor connected between said second and third connection lines;

a first comparator, connected to said first and third connection lines, for comparing a voltage at said first connection line with a voltage at said third connection line to increase a difference between the voltages at said first and third connection lines, in response to a second control signal;

a second comparator, connected to said second and fourth connection lines, for comparing a voltage at said second connection Line with a voltage at said fourth connection line to increase a difference between the voltages at said second and fourth connection lines in response to a third control signal.

31. The device as set forth in claim 30, wherein a stray capacitance of each of said first and third connection lines is different from a stray capacitance of each of said second and fourth connection lines.

32. The device as set forth in claim 30, wherein a timing of said second control signal is different from a timing of said third control signal.

33. The device as set forth in claim 30, further comprising multi-valued memory cells connected to said first, second, third and fourth connection lines.

34. A semiconductor device comprising:

first, second, third, fourth, fifth, sixth, seventh and eighth connection lines;

a first switching element connected between said second and third connection lines and controlled by a first control signal;

a second switching element connected between said sixth and seventh connection lines and controlled by said first control signal;

a third switching element connected between said first and second connection lines and controlled by a second control signal;

a fourth switching element connected between said fifth and sixth connection lines and controlled by said second control signal;

a fifth switching element connected between said third and fourth connection lines and controlled by a third control signal;

a sixth switching element connected between said seventh and eighth connection lines and controlled by said third control signal;

a first capacitor connected between said second and seventh connection lines;

a second capacitor connected between said third and sixth connection lines;

a first comparator, connected to said second and sixth connection lines, for comparing a voltage at said second connection Line with a voltage at said sixth connection line to increase a difference between the voltages at said second and sixth connection lines in response to a fourth control signal;

a second comparator, connected to said third and seventh connection lines, for comparing a voltage at said third connection line with a voltage at said seventh connection line to increase a difference between the voltages at said third and sixth connection lines, in response to a fifth control signal.

35. The device as set forth in claim 34, wherein capacitances of said first to eighth connection lines are substantially the same.

36. The device as set forth in claim 34, wherein a timing of said fourth control signal is different from a timing of said fifth control signal.

* * * * *